United States Patent
Kutsukake

(10) Patent No.: US 7,898,854 B2
(45) Date of Patent: Mar. 1, 2011

(54) SEMICONDUCTOR MEMORY DEVICE AND METHOD OF PRELIMINARY DATA WRITING TO SELECT MEMORY CELL TRANSISTORS

(75) Inventor: Hiroyuki Kutsukake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 12/393,662

(22) Filed: Feb. 26, 2009

(65) Prior Publication Data

US 2009/0316478 A1    Dec. 24, 2009

(30) Foreign Application Priority Data

Feb. 28, 2008    (JP) .................. 2008-048409

(51) Int. Cl.
*G11C 16/04*    (2006.01)

(52) U.S. Cl. .......... 365/185.03; 365/185.05; 365/185.13; 365/185.14; 365/230.03

(58) Field of Classification Search ............. 365/185.03, 365/185.05, 185.13, 230.03
See application file for complete search history.

(56) References Cited

U.S. PATENT DOCUMENTS

| | | | |
|---|---|---|---|
| 7,064,379 B2 | 6/2006 | Kutsukake et al. | |
| 7,244,984 B2 | 7/2007 | Kamigaichi et al. | |
| 7,374,995 B2 | 5/2008 | Kutsukake et al. | |
| 7,411,825 B2 | 8/2008 | Kutsukake et al. | |
| 2007/0036000 A1* | 2/2007 | Kutsukake et al. | 365/185.17 |
| 2007/0047301 A1* | 3/2007 | Aritome | 365/185.05 |
| 2007/0224736 A1 | 9/2007 | Kamigaichi et al. | |

FOREIGN PATENT DOCUMENTS

| | | |
|---|---|---|
| JP | 8-115987 | 5/1996 |
| JP | 2005-56989 | 3/2005 |
| JP | 2005-235260 | 9/2005 |
| JP | 2005-354003 | 12/2005 |
| JP | 2007-35166 | 2/2007 |

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A semiconductor memory device includes first to third memory cell units each including a first select transistor, a second select transistor and a plurality of memory cell transistors which are connected in series in a first direction between the first select transistor and the second select transistor, the first and second select transistors of the respective memory cell transistors being disposed to neighbor in a second direction crossing the first direction. Those of the memory cell transistors, which neighbor the first and second select transistors, are used as select memory cell transistors.

16 Claims, 23 Drawing Sheets

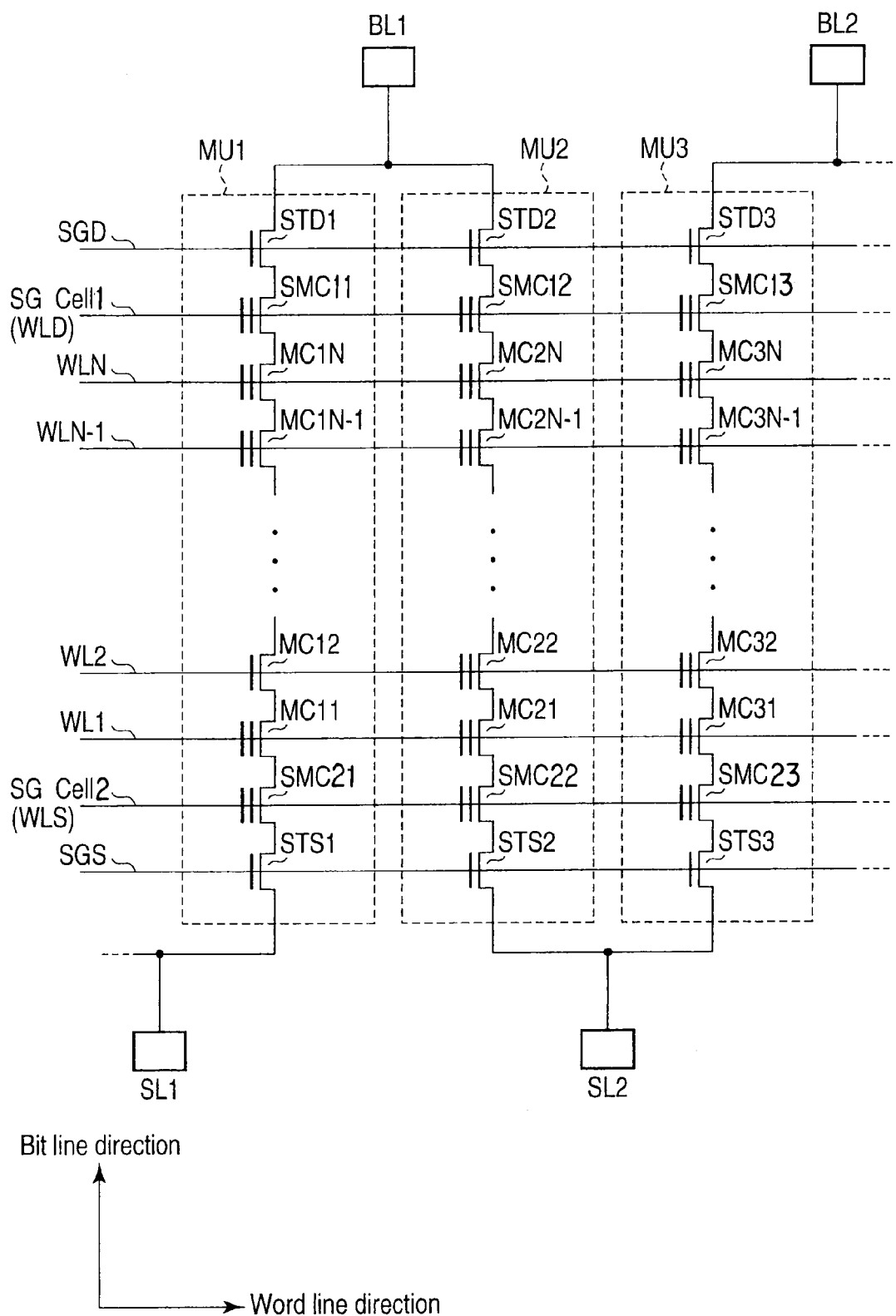
F I G. 1

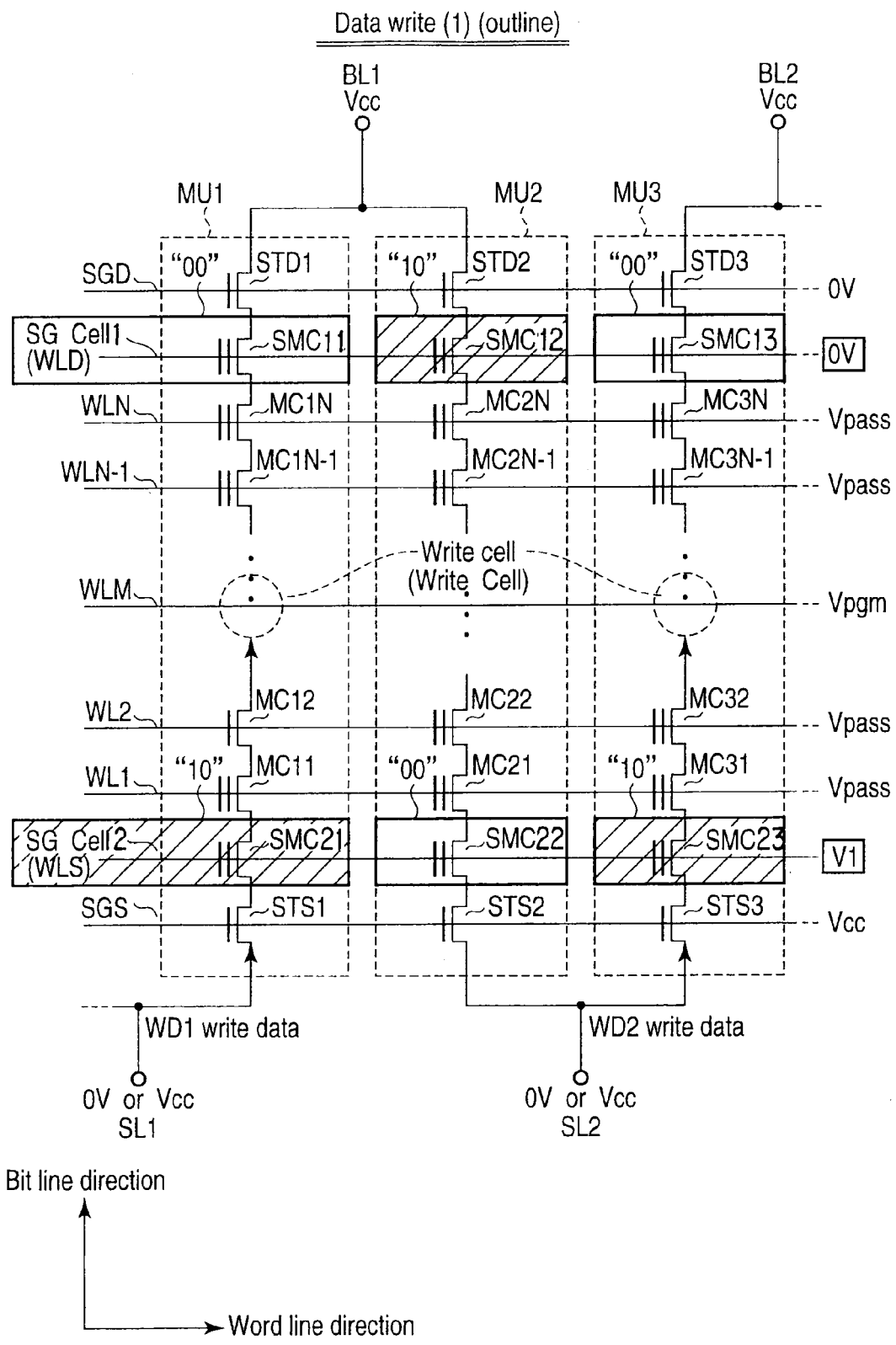
F I G. 2

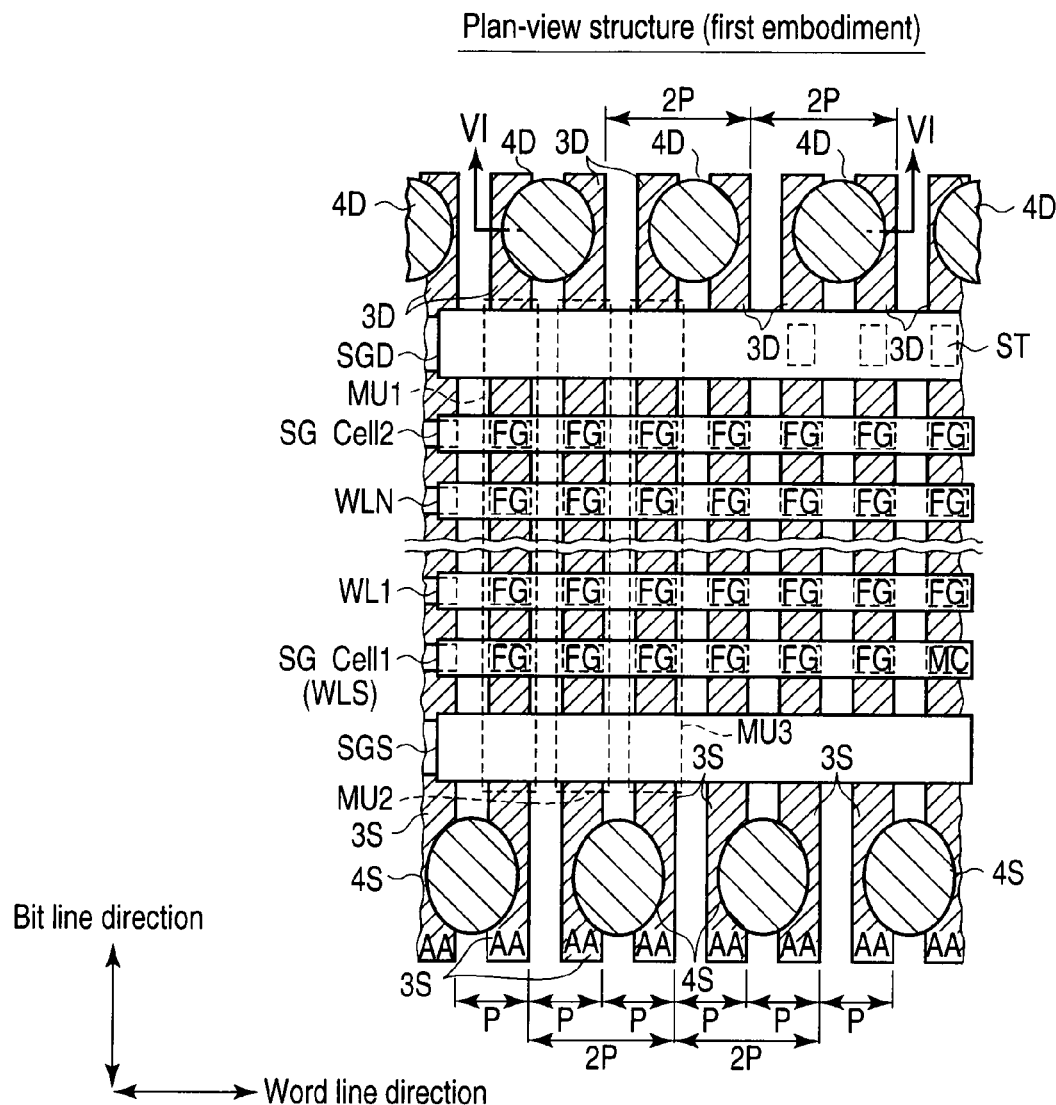
F I G. 4
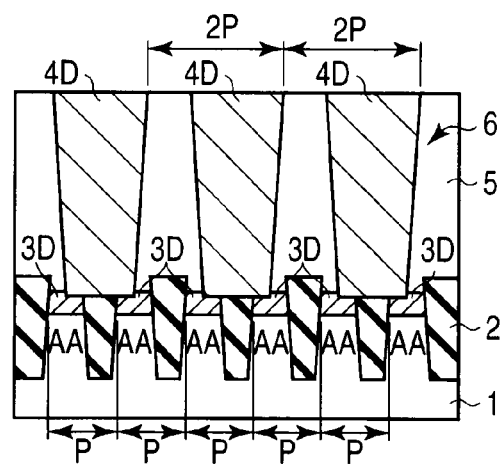
F I G. 5

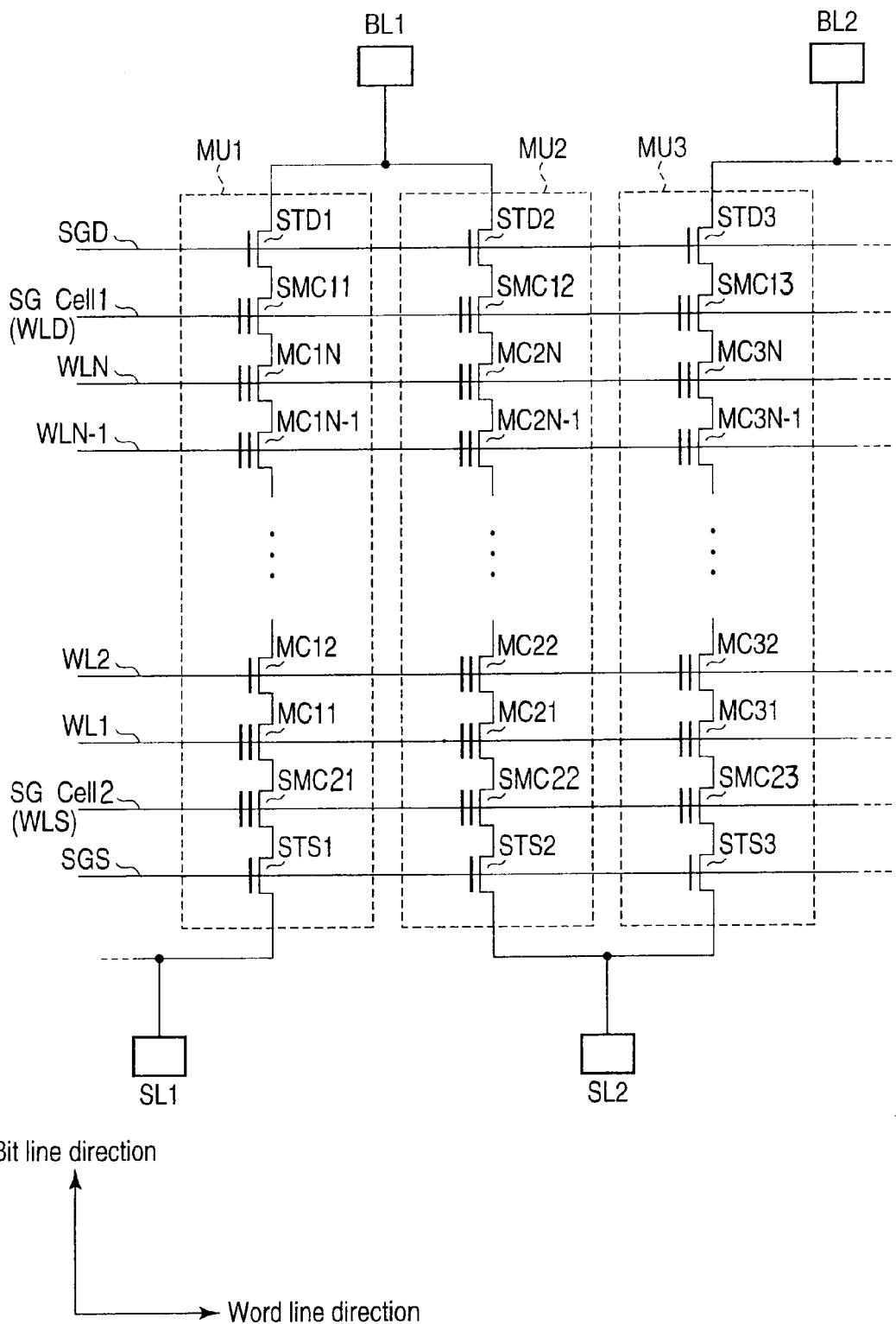
F I G. 6

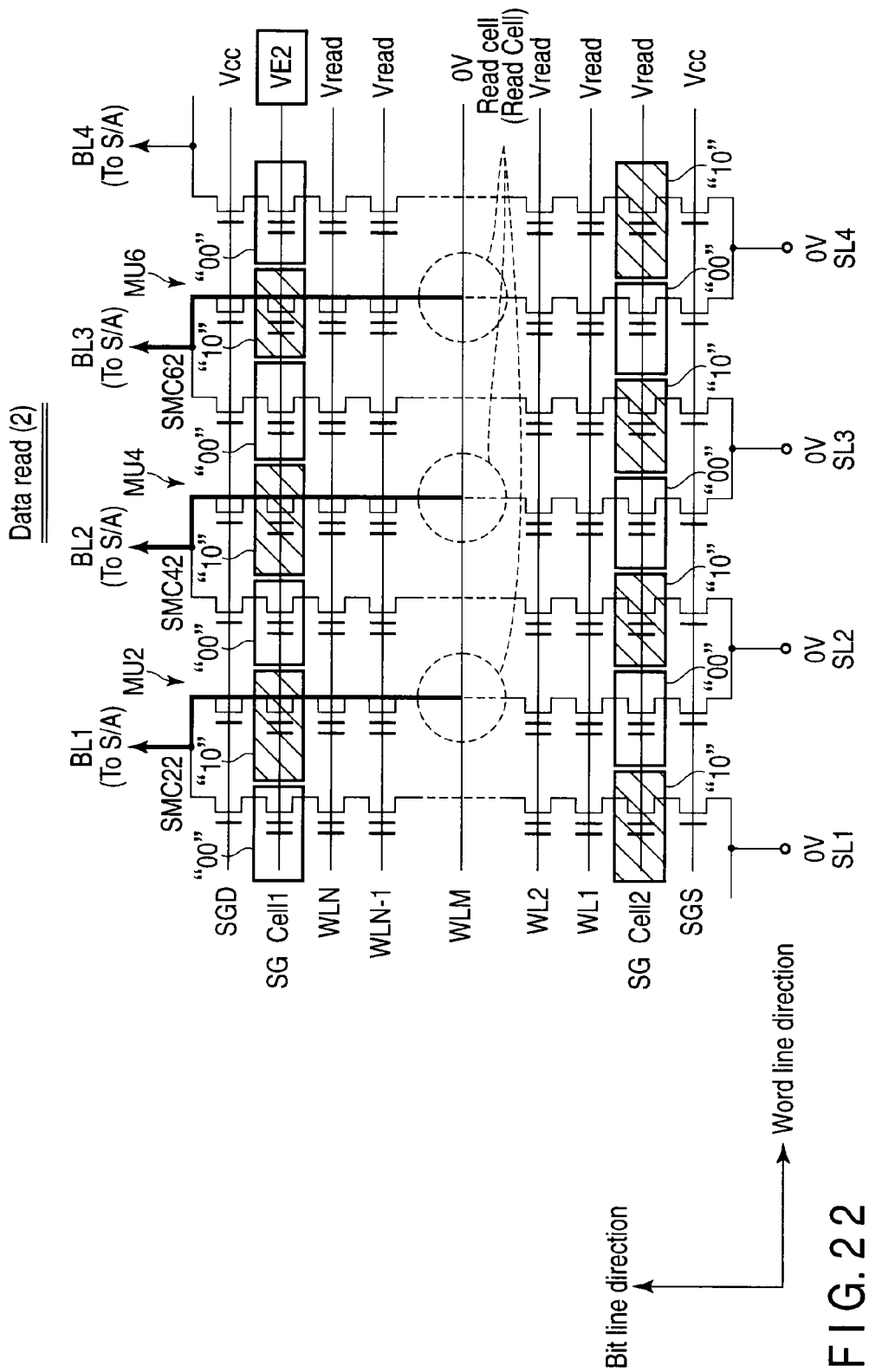
F I G. 22

SEMICONDUCTOR MEMORY DEVICE AND METHOD OF PRELIMINARY DATA WRITING TO SELECT MEMORY CELL TRANSISTORS

CROSS-REFERENCE TO RELATED APPLICATIONS

This application is based upon and claims the benefit of priority from prior Japanese Patent Application No. 2008-048409, filed Feb. 28, 2008, the entire contents of which are incorporated herein by reference.

BACKGROUND OF THE INVENTION

1. Field of the Invention

The present invention relates to a semiconductor memory device.

2. Description of the Related Art

In recent years, a semiconductor memory device, for instance, a NAND flash memory, has begun to be used as a memory for various electronic devices, such as portable audio devices, by virtue of its advantages of large capacity and nonvolatility (see, e.g. Jpn. Pat. Appln. KOKAI Publication No. 2005-235260).

A self-boost method is known as a write method of the NAND flash memory. In this write method, a voltage of 0V or a power supply voltage Vcc is applied to a bit line. A drain-side select gate is set in an ON state at the power supply voltage Vcc, a source-side select gate is set in an OFF state at 0V, and a source line is set at an internal power supply voltage Vcc. Thereby, each of memory cell units is set at "0" (write state) or "1" (boost state).

On the other hand, in a read operation, a word line of a read cell is fixed at 0V. The other cells are set at a read voltage Vread, a drain-side select gate is set in the ON state at the power supply voltage Vcc, and a source-side select gate is cut off at 0V. Thereby, the bit line and wiring line are charged. Subsequently, the source-side select gate is set in the ON state at the power supply voltage Vcc. At this time, when the read cell is in the write state, the word line is at 0V, and the drain-side potential, which has been cut off and charged, does not vary. On the other hand, when the read cell is in an erase state, the word line cannot be cut off at 0V, and the word line is discharged to the source side, and the drain-side potential lowers. Data read is executed by monitoring the bit line potential by means of, e.g. a sense amplifier.

As has been described above, in the conventional structure, each bit line needs to be provided with one bit line contact. Since the pitch of neighboring contacts is determined by the bit line pitch, the processing of contacts becomes very difficult as the degree of microfabrication progresses. Thus, there is a tendency that the conventional structure is disadvantageous in terms of microfabrication.

BRIEF SUMMARY OF THE INVENTION

According to an aspect of the present invention, there is provided a semiconductor memory device comprising: first to third memory cell units each including a first select transistor, a second select transistor and a plurality of memory cell transistors which are connected in series in a first direction between the first select transistor and the second select transistor, the first and second select transistors of the respective memory cell transistors being disposed to neighbor in a second direction crossing the first direction; a first bit line which is commonly connected to an end portion of the first select transistor of the first memory cell unit and to an end portion of the first select transistor of the second memory cell unit; a second bit line which is connected to an end portion of the first select transistor of the third memory cell unit; a first source line which is connected to an end portion of the second select transistor of the first memory cell unit; and a second source line which is commonly connected to an end portion of the second select transistor of the second memory cell unit and to an end portion of the second select transistor of the third memory cell unit, wherein those of the memory cell transistors, which neighbor the first and second select transistors, are used as select memory cell transistors.

According to another aspect of the present invention, there is provided a semiconductor memory device comprising: first to third memory cell units each including a first select transistor, a second select transistor and a plurality of memory cell transistors which are connected in series in a first direction between the first select transistor and the second select transistor, the first and second select transistors of the respective memory cell transistors being disposed to neighbor in a second direction crossing the first direction; a first bit line which is commonly connected to an end portion of the first select transistor of the first memory cell unit and to an end portion of the first select transistor of the second memory cell unit; a second bit line which is connected to an end portion of the first select transistor of the third memory cell unit; a first source line which is connected to an end portion of the second select transistor of the first memory cell unit; a second source line which is commonly connected to an end portion of the second select transistor of the second memory cell unit and to an end portion of the second select transistor of the third memory cell unit; first and second bit line contacts which are electrically connected to the first and second bit lines and are disposed in a staggered fashion; and first and second source line contacts which are electrically connected to the first and second source lines and are disposed in a staggered fashion, wherein those of the memory cell transistors, which neighbor the first and second select transistors, are used as select memory cell transistors.

According to another aspect of the present invention, there is provided a method of preliminary data writing comprising: first to third memory cell units each including a first select transistor, a second select transistor and a plurality of memory cell transistors which are connected in series in a first direction between the first select transistor and the second select transistor, the first and second select transistors of the respective memory cell units being disposed to neighbor in a second direction crossing the first direction; a first select memory cell transistor used as the memory cell transistor which neighbor the first select transistors of the first memory cell unit a second select memory cell transistor used as the memory cell transistor which neighbor the second select transistors of the first memory cell unit a third select memory cell transistor used as the memory cell transistor which neighbor the first select transistors of the second memory cell unit; a fourth select memory cell transistor used as the memory cell transistor which neighbor the second select transistors of the second memory cell unit; a fifth select memory cell transistor used as the memory cell transistor which neighbor the first select transistors of the third memory cell unit; a sixth select memory cell transistor used as the memory cell transistor which neighbor the second select transistors of the third memory cell unit wherein the first, fourth and sixth select memory cell transistors have a first threshold voltage, and the second, third and fifth select memory cell transistors have a second threshold voltage which is higher than the first threshold voltage when the first to third memory cell unit is in a format state.

BRIEF DESCRIPTION OF THE SEVERAL VIEWS OF THE DRAWING

FIG. 1 is an equivalent circuit diagram for describing a semiconductor memory device according to an outline of the present invention;

FIG. 2 is an equivalent circuit diagram for describing the semiconductor memory device according to the outline of the invention;

FIG. 4 is a plan view showing a plan-view structure of the semiconductor memory device according to the first embodiment;

FIG. 5 is a cross-sectional view taken along line VI-VI in FIG. 4;

FIG. 6 is an equivalent circuit diagram for describing the semiconductor memory device according to the first embodiment;

FIG. 22 is a view showing a data read operation (2) of the semiconductor memory device according to the first embodiment;

DETAILED DESCRIPTION OF THE INVENTION

Outline

Figure 3:
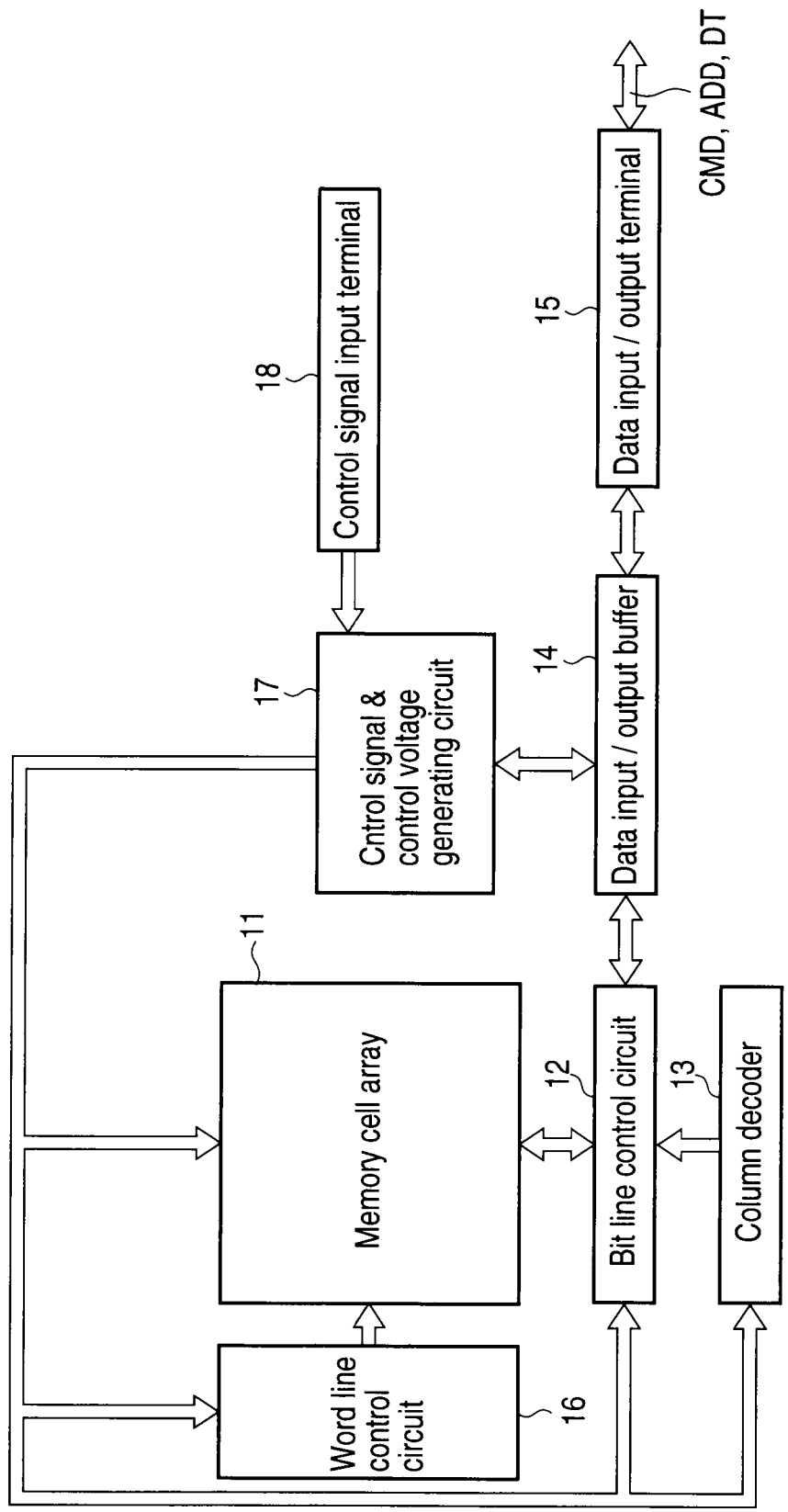
FIG. 3 is a block diagram showing an example of the entire structure of a semiconductor memory device according to a first embodiment of the invention.

To begin with, the outline of the present invention is described with reference to FIG. 1 and FIG. 2. FIG. 1 is a circuit diagram showing a semiconductor memory device according to the outline of the invention.

In an example of the present invention, there is proposed a semiconductor memory device which is advantageous in microfabrication and can reduce a defect ratio.

The structure of this semiconductor memory device is, for example, as shown in FIG. 1 and FIG. 2. FIG. 2 is a circuit diagram illustrating a data write operation of the semiconductor memory device according to the outline.

As shown in FIG. 1, the semiconductor memory device according to this example comprises first select transistors STD1 to STD3, second select transistors STS1 to STS3, and a plurality of memory cell transistors (MC) which are connected in series between each first select transistor and each second select transistor in a Bit line direction in FIG. 1 and FIG. 2. The semiconductor memory device further includes first to third memory cell units (MU1 to MU3), whose first and second select transistors are disposed to neighbor in a Word line direction in FIG. 1 and FIG. 2, a first bit line BL1 which is commonly connected to an end of the first select transistor of the first memory cell unit and an end of the first select transistor of the second memory cell unit, a second bit line BL2 which is connected to an end of the first select transistor of the third memory cell unit, a first source line SL1 which is connected to an end of the second select transistor of the first memory cell unit, and a second source line SL2 which is commonly connected to an end of the second select transistor of the second memory cell unit and an end of the second select transistor of the third memory cell unit.

Thus, in the three memory cell units, MU1 to MU3, which neighbor in the word line direction, the source line SL1, SL2, and the bit line BL1, BL2, can be shared by double-pitch contact. Therefore, microfabrication can advantageously be achieved.

Further, as shown in FIG. 2, first to sixth memory cell transistors SMC21, SMC11, SMC22, SMC12, SMC23, and SMC 13, which neighbor the select transistors of the first to third memory cell units, are used as select memory cell transistors.

A description is given of an example method of using memory cell transistors as select memory cell transistors.

The select memory cell transistor includes a charge accumulation layer for accumulating electric charge. The threshold value of the select memory cell transistor varies in accordance with the amount of charge which is accumulated in the charge accumulation layer.

In order to use memory cell transistors as select memory cell transistors, preliminary data write is executed in the first to sixth memory cell transistors SMC21, SMC11, SMC22, SMC12, SMC23, and SMC 13. In the present example, the preliminary data write is executed at a time after data erase and before data write. The threshold voltages of the first to sixth memory cell transistors after the preliminary write are as shown in FIG. 2.

Specifically, preliminary write is executed in each of the first, fourth and fifth memory cell transistors SMC21, SMC12, and SMC23 so that the threshold value thereof is set at a "10" level. In addition, preliminary write is executed in each of the second, third and sixth memory cell transistors SMC11, SMC22, and SMC13 so that the threshold value thereof is set at a "00" level. Accordingly, the threshold value of each of the first, fourth and fifth memory cell transistors SMC21, SMC12, and SMC23 is lower than the threshold value of each of the second, third and sixth memory cell transistors SMC11, SMC22, and SMC13.

Subsequently, a voltage V1 (i.e. a voltage which turns on the transistor less or equal "10" level) between the "10" level and "00" level is applied to a second cell select gate line SG Cell2 (WLS). Thereby, the first and third memory cell units MU1 and MU3 are selected. On the other hand, since the third memory cell transistor SMC22 that is at the "00" level is in the cut-off state, the second memory cell unit MU2 is not selected.

Subsequently, write data WD1 and WD2 are input from the first and second source lines SL1 and SL2, thereby executing data write in the write cells which are connected to the select word line WLM. As will be described later, the first to sixth memory cell transistors SMC21, SMC11, SMC22, SMC12, SMC23, and SMC 13 can be used as the select memory cell transistors, not only in the write operation but also in the read operation.

As has been described above, the structure of the present example is obviously advantageous for microfabrication.

A description will now be given of some embodiments of the invention, which are considered to be the best modes. In the description below, common parts are denoted by like reference numerals throughout the drawings. In addition, in the following description, a multilevel NAND flash memory (MLC: multilevel cell) is taken as an example.

First Embodiment

1. Example of Entire Structure

To begin with, referring to FIG. 3, a description is given of an example of the entire structure of the semiconductor memory device according to a first embodiment of the present invention. FIG. 3 is a block diagram showing the example of the entire structure of the semiconductor memory device according to the first embodiment.

As shown in FIG. 3, the NAND flash memory of this embodiment comprises a memory cell array 11, a bit line control circuit 12, a column decoder 13, a data input/output buffer 14, a data input/output terminal 15, a word line control circuit 16, a control signal & control voltage generating circuit 17, and a control signal input terminal 18.

The memory cell array 11 is composed of a plurality of blocks. The word line control circuit 16 for controlling word lines and the bit line control circuit 12 for controlling bit lines are connected to the memory cell array 11.

The bit line control circuit 12 reads data of memory cells in the memory cell array 11 via the bit lines, and detects the states of the memory cells in the memory cell array 11 via the bit lines. In addition, the bit line control circuit 12 executes data write in the memory cells by applying write control voltages to the memory cells in the memory cell array 11 via the bit lines. The column decoder 13, the data input/output buffer 14 and the control signal & control voltage generating circuit 17 are connected to the bit line control circuit 12.

Data memory circuits (not shown) are provided in the bit line control circuit 12, and the data memory circuits are selected by the column decoder 13. The data of the memory cells, which are read into the data memory circuits, are output to the outside from the data input/output terminal 15 via the data input/output buffer 14. The data input/output terminal 15 is connected to, for example, a host device which is disposed outside the NAND flash memory.

The host device is, for instance, a microcomputer, which receives data that is output from the data input/output terminal 15. Further, the host device outputs various commands CMD which control the operation of the NAND flash memory, addresses ADD and data DT. Write data, which is input to the data input/output terminal 15 from the host device, is delivered via the data input/output buffer 14 to the data memory circuits (not shown) which are selected by the column decoder 13. On the other hand, the commands and addresses are delivered to the control signal & control voltage generating circuit 17.

The word line control circuit 16 selects the word lines in the memory cell array 11, and applies voltages necessary for data read, write or erase to the selected word lines.

The control signal & control voltage generating circuit 17 is connected to the memory cell array 11, bit line control circuit 12, column decoder 13, data input/output buffer 14 and word line control circuit 16. These connected structural circuits are controlled by the control signal & control voltage generating circuit 17. The control signal & control voltage generating circuit 17 is connected to the control signal input terminal 18, and is controlled by control signals, such as an ALE (address latch enable) signal, which are input from the host device via the control signal input terminal 18.

The word line control circuit 16, bit line control circuit 12, column decoder 13 and control signal & control voltage generating circuit 17 constitute a write circuit and a read circuit.

2. Plan-View Structure Example, Cross-Sectional Structure Example, and Circuit Structure Example Next, a plan-view structure example, a cross-sectional structure example, and a circuit structure example of the present embodiment are described with reference to FIG. 4 to FIG. 7. FIG. 4 is a plan view showing an example of the structure of the memory cell array 11 which is included in the semiconductor memory device according to the present embodiment. FIG. 5 is a cross-sectional view taken along line VI-VI in FIG. 4. FIG. 6 is a circuit diagram showing an example of the equivalent circuit of the memory cell array 11 according to the present embodiment.

As shown in FIG. 4 to FIG. 6, device isolation regions 2 are formed on a semiconductor substrate, for example, a P-type silicon substrate (or P-type silicon well) 1. The device isolation regions 2 isolate device regions AA on the surface of the substrate 1. An example of the device isolation region 2 is a shallow trench isolation (STI). The device regions AA and device isolation regions 2 are arranged with a pitch P in the bit line direction on the substrate 1. An example of the pitch P is 2F. "F" is a minimum feature size. For example, both the device region AA and device isolation region 2 are formed with the minimum feature size F.

Word lines WL1, . . . WLN, which extend in the word line direction, are disposed at predetermined intervals in the bit line direction. Select gate lines SGD and SGS, which extend in the word line direction, are disposed so as to sandwich the word lines WL1, . . . WLN. Memory cell transistors MC and select gate transistors ST are formed at intersections between the word lines WL1, . . . WLN and select gate lines SGD and SGS and the device regions AA.

A memory cell unit, MU1, MU2, . . . MUN, is composed of memory cell transistors MC and select gate transistors ST sandwiching the memory cell transistors MC, which are disposed in series in one device region AA. Specifically, the memory cell transistors MC and select gate transistors ST of the respective neighboring memory cell units MU1, MU2, . . . MUN are adjacently disposed.

N-type diffusion layers 3D and 3S are formed in the device regions AA which are located outside the select gate lines SGD and SGS. Further, bit line contacts 4D are disposed on the neighboring N-type diffusion layers 3D, and source line contacts 4S are disposed on the neighboring N-type diffusion layers 3S. Specifically, the bit line contacts 4D and source line contacts 4S extend over the neighboring memory cell units MU and are disposed with a pitch 2P. An example of the pitch P is 2F. Specifically, the bit line contacts 4D and source line contacts 4S are disposed with double the pitch of the device regions AA (double-pitch contact). In addition, the bit line contacts 4D and source line contacts 4S are displaced by the pitch P in the word line direction. With this structure, the end portions of the memory cell unit MU are commonly connected to memory cell units MU which neighbor on different sides.

The cross section of the bit line contact 4D is described in detail with reference to FIG. 5. The bit line contact 4D in this example is an electrical conductor which is buried in a contact hole 6 that is formed in an interlayer insulation film 5 and exposes the neighboring device regions and the device isolation region 2 that is interposed between these device regions. The interlayer insulation film 5 is formed on the substrate 1 having the device isolation regions 2. Examples of the electrical conductor include tungsten, polysilicon and a silicide compound. In the present example, the bit line BL (BL1, BL2, BL3, . . . ) is connected to the N-type diffusion layers 3D via the bit line contact 4D, but the structure of connection is not limited to this. For example, the bit line BL may directly be connected to the N-type diffusion layers 3D via the contact hole 6, without using the bit line contact 4D.

Next, the circuit structure is described in detail with reference to FIG. 6. The memory cell units MU (MU1, MU2, MU3, . . . ) are disposed on the device regions AA. The memory cell unit MU in this example includes memory cell transistors MC (MC11 to MC3N, . . . ) which are connected in series between block select transistors STD (STD1, STD2, STD3, . . . ) and STS (STS1, STS2, STS3, . . . ).

In the present example, one bit line BL (BL1, BL2, BL3, . . . ) is disposed in association with two neighboring device regions AA.

The first bit line BL1 is commonly connected to the first select transistor STD1 of the first memory cell unit MU1 and the first select transistor STD2 of the second memory cell unit MU2. The second bit line BL2 is commonly connected to the first select transistor STD3 of the third memory cell unit MU3 and the first select transistor of the fourth memory cell unit MU4 (not shown). The first memory cell unit MU1, second memory cell unit MU2 and third memory cell unit MU3 neighbor in the word line direction, and share the word lines WL (WL1, WL2, . . . WLN). One end of the current path of each of the first to third memory cell units MU1 to MU3 is the N-type diffusion layer 3D in this example, and is the drain of the drain-side block select transistor STD. The bit line BL (BL1, BL2, BL3, . . . ) in this example is connected to the N-type diffusion layer 3D via the bit line contact 4D.

The source lines SL (SL1, SL2, . . . ) operate independently, and are able to supply different source potentials to the memory cell units MU which are connected to the source lines SL.

The first source line SL1 is connected to the second select transistor STS1 of the first memory cell unit MU1, and the second source line SL2 is commonly connected to the second select transistor STS2 of the second memory cell unit MU2 and the second select transistor STS3 of the third memory cell unit MU3. The other end of the current path of each of the first to third memory cell units MU1 to MU3 is the N-type diffusion layer 3S in this example, and is the source of the source-side block select transistor STS. Each of the first and second source lines SL1 and SL2 in this example is connected to the N-type diffusion layer 3S via the source line contact 4S. The cross-sectional structure of the source line contact is the same as that of the bit line contact, so a description is omitted here.

In the present example, select memory transistors are further provided in addition to the block select transistors STD and STS. In this example, of the matrix-arrayed memory cell transistors MC, those memory cell transistors (SMC21, SMC22, SMC23, . . . ), which neighbor the drain-side and source-side block select transistors (STD1, STD2, STD3, . . . ) (STS1, STS2, STS3, . . . ) of the memory cell units MU, are used as the select memory cell transistors.

Figure 7:
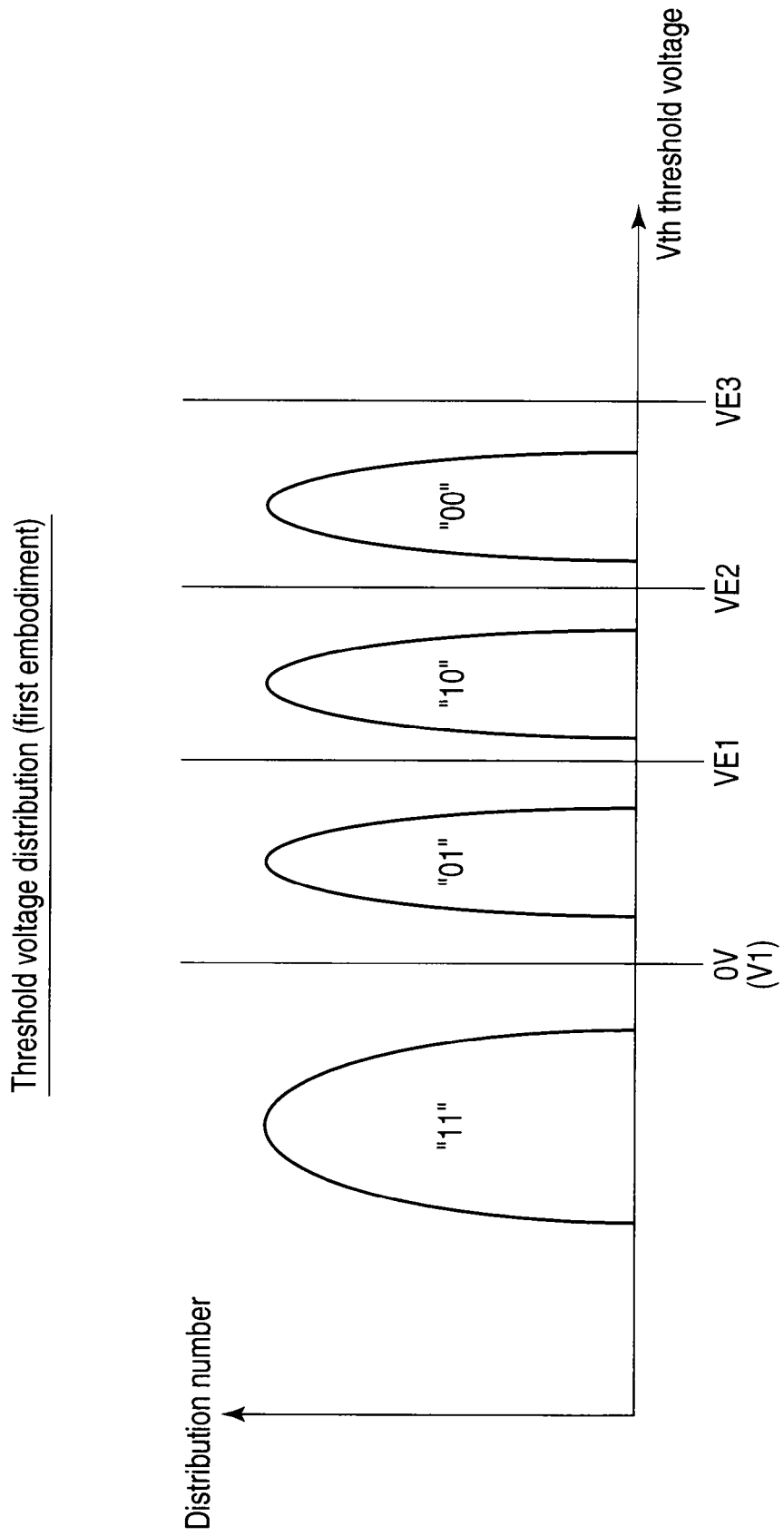
FIG. 7 is a graph showing a threshold voltage distribution of the semiconductor memory device according to the first embodiment.

The memory cell array 11 of the semiconductor memory device according to this example is composed of multilevel memories, each of which can store multi-bit data in one memory cell transistor MC. FIG. 7 shows the threshold value distribution of the multilevel NAND flash memory in this example.

As shown in FIG. 7, the memory cell transistor MC in this example can store four data of "11", "01", "10" and "00" in the order from the lowest threshold voltage Vth. The threshold voltage Vth of the memory cell transistor, which stores "11" data, is Vth<0V. The threshold voltage Vth of the memory cell transistor, which stores "01" data, is 0V<Vth<VE1. The threshold voltage Vth of the memory cell transistor, which stores "10" data, is VE1<Vth<VE2. The threshold voltage Vth of the memory cell transistor, which stores "00" data, is VE2<Vth<VE3.

It may be said that the write mode of the 4-value NAND flash memory (hereinafter referred to as "4-value mode") of the present embodiment, as compared to the write mode of the 2-value NAND flash memory (hereinafter referred to as "2-value mode"), is an operation mode in which a lower bit and an upper bit are used.

Whether data is to be written in the memory cell transistor MC in the 2-value mode or in the 4-value mode is controlled, for example, by a controller or the like (not shown) which is provided outside the NAND flash memory. Specifically, a lower page address is allocated to the lower bit of the 2-bit data, and an upper page address is allocated to the upper bit. In the case where data is to be written in the memory cell transistor MC in the 2-value mode, the controller or the like writes the data by using only the lower page address of the page addresses. In the case where data is to be written in the memory cell transistor MC in the 4-value mode, the controller or the like can write the data by using both the upper page address and the lower page address.

The 4-value mode data write is first executed from the lower bit. If the erase state is "11" ("--", "-" means "indefinite"), the lower bit is first written. Thereby, the memory cell transistor MC stores "1" ("−1") or "0" ("−0"). In the case of the 2-value mode, data write is thus completed. In the case of data write in the 4-value mode, the upper bit is subsequently written. As a result, the memory cell transistor MC, which stores "1" ("−1"), stores "11" or "01", and the memory cell transistor MC, which stores "0" ("−0"), stores "10" or "00".

3. Examples of Cell Operation

Next, examples of the cell operation are described with reference to FIG. 8 to FIG. 21. The examples of the cell operation are generally classified into a preliminary data write operation, a data write operation and a data read operation. These three operations will be described in succession.

3-1. Preliminary Data Write Operation

Before data is written in a memory cell block which is in a format state, a preliminary data write operation is executed in the memory cell transistors (SMC11, SMC12, SMC21, ...) which neighbor the select transistors SGS and SGD. As is described later, this preliminary data write is needed in order to cause the memory cell transistors (SMC11, SMC12, SMC21, ...), which neighbor the select transistors SGS and SGD, to operate in a multilevel operation and use them as select memory cell transistors (select gates) at the time of executing the write operation and read operation. The memory cell block, in this context, refers to a block which is composed of, e.g. 1042 memory cell units MU.

Figure 8:
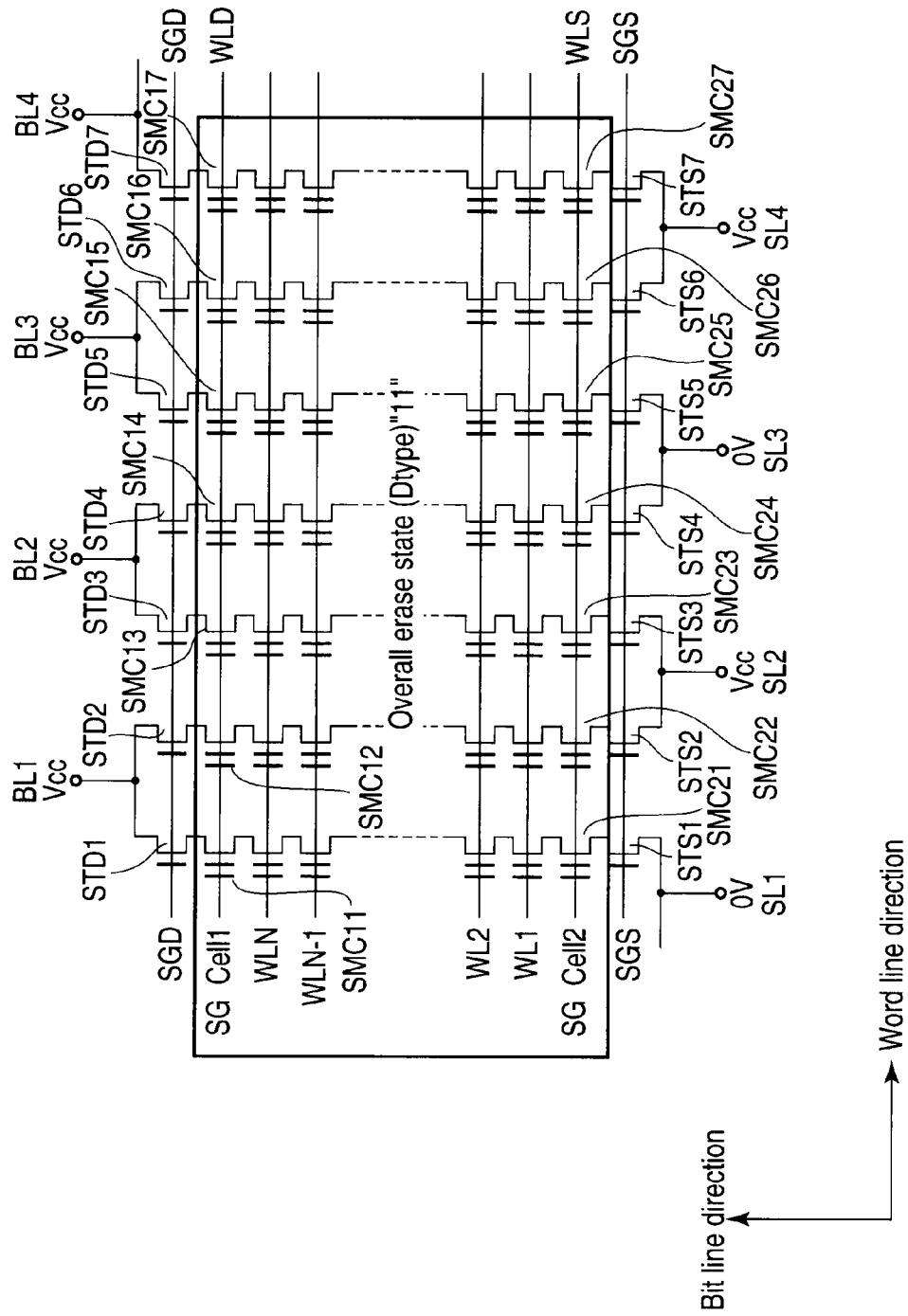
FIG. 8 is a view showing an operation of preliminary data write of the semiconductor memory device according to the first embodiment.

As shown in FIG. 8, all the memory cell transistors in the memory cell block are set in the erase state ("11" state: depletion state (Dtype)). Specifically, all electrons in the floating electrode in each memory cell transistor MC are discharged to the substrate 1. As a result, the memory cell block is set in the format state.

Figure 9:
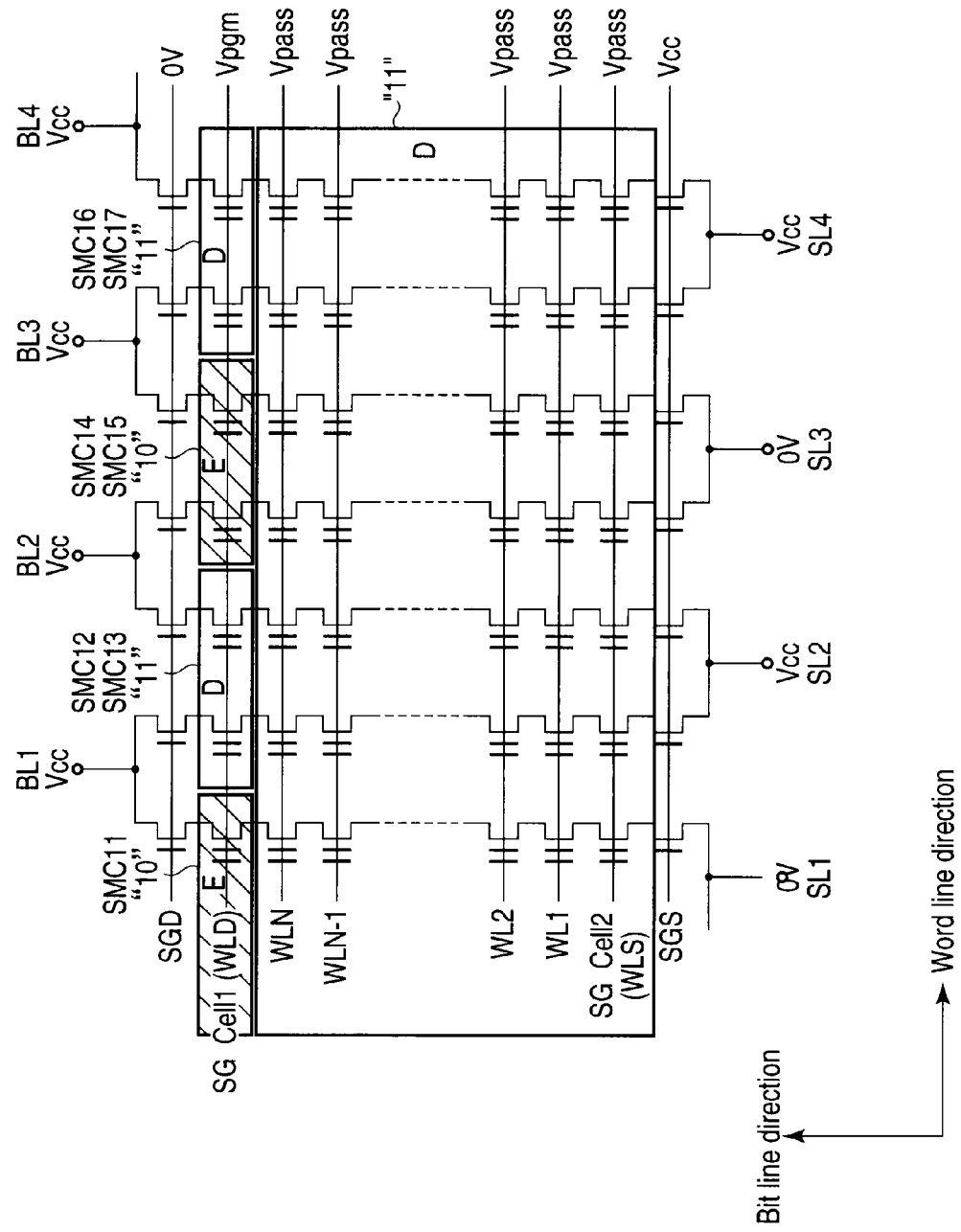
FIG. 9 is a view showing an operation of the preliminary data write of the semiconductor memory device according to the first embodiment.

Subsequently, as shown in FIG. 9, 0V is applied to the drain-side block select gate line SGD, and an internal power supply voltage Vcc, for example, is applied to the source-side block select gate line SGS. At this time, the potential of the bit line BL (BL1, BL2, ...) is set at, e.g. the internal power supply voltage Vcc. Then, the potential of the first and third source lines SL1 and SL3 is set at 0V, and the potential of the second and fourth source lines SL2 and SL4 is set at Vcc. Accordingly, the drain-side block select transistors STD (STD1, STD2, STD3, ...) are all turned off, the source-side block select transistors STS (STS1, STS4, STS5, ...) which are connected to the first and third source lines SL1 and SL3 are turned on, and the source-side block select transistors STS (STS2, STS3, ...) which are connected to the second and fourth source lines SL2 and SL4 are turned off.

Then, the potential of the word lines WL (WL1 to WLN) and the potential of the first cell select gate line SG Cell2 are set at a pass voltage Vpass that is a voltage at which the memory cell transistor MC, whose threshold is at "00" level, is turned on. Further, the potential of the second cell select gate line SG Cell is set at a write voltage Vpgm which is higher than the pass voltage Vpass. Accordingly, data corresponding to the potential of the first and third source lines SL1 and SL3 is written in the memory cell transistors MC (SMC11, SMC14, SMC15, ...) whose gates are the second cell select gate line SG Cell2.

As a result, as shown in FIG. 9, data write is executed in the memory cell transistors SMC11, SMC14 and SMC15 up to the "10" state.

As described above, since the source line potential of 0 V/Vcc is alternately applied, data write can be executed in the memory cell transistors SMC11, SMC14 and SMC15 up to the "10" state (enhancement type "E") alternately and selectively in units of two bits.

Figure 10:
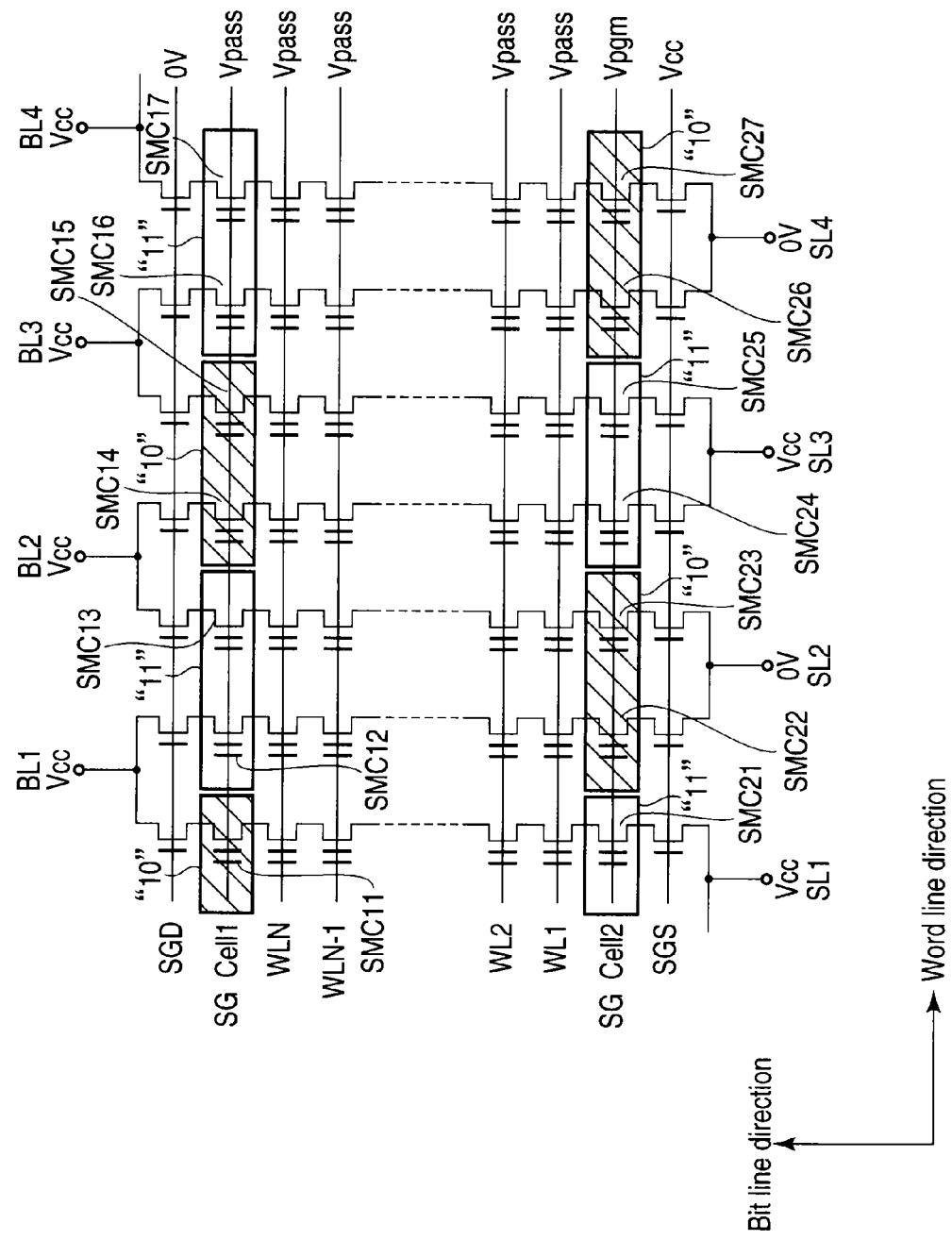
FIG. 10 is a view showing an operation of the preliminary data write of the semiconductor memory device according to the first embodiment.

Then, as shown in FIG. 10, as in the case described above, preliminary data write is executed in the source-side second cell select gate SG Cell2 (WLS). As a result, as shown in FIG. 10, preliminary data write of "10" level is executed alternately and selectively in units of two bits in the memory cell transistors MC (SMC22, SMC23, SMC26, SMC27, ...) whose gates are the second cell select gate line SG Cell2. At this time, the voltage of the source line SL is so set that the threshold levels of the two select memory cell transistors of the memory cell unit may become "10" and "11".

Figure 11:
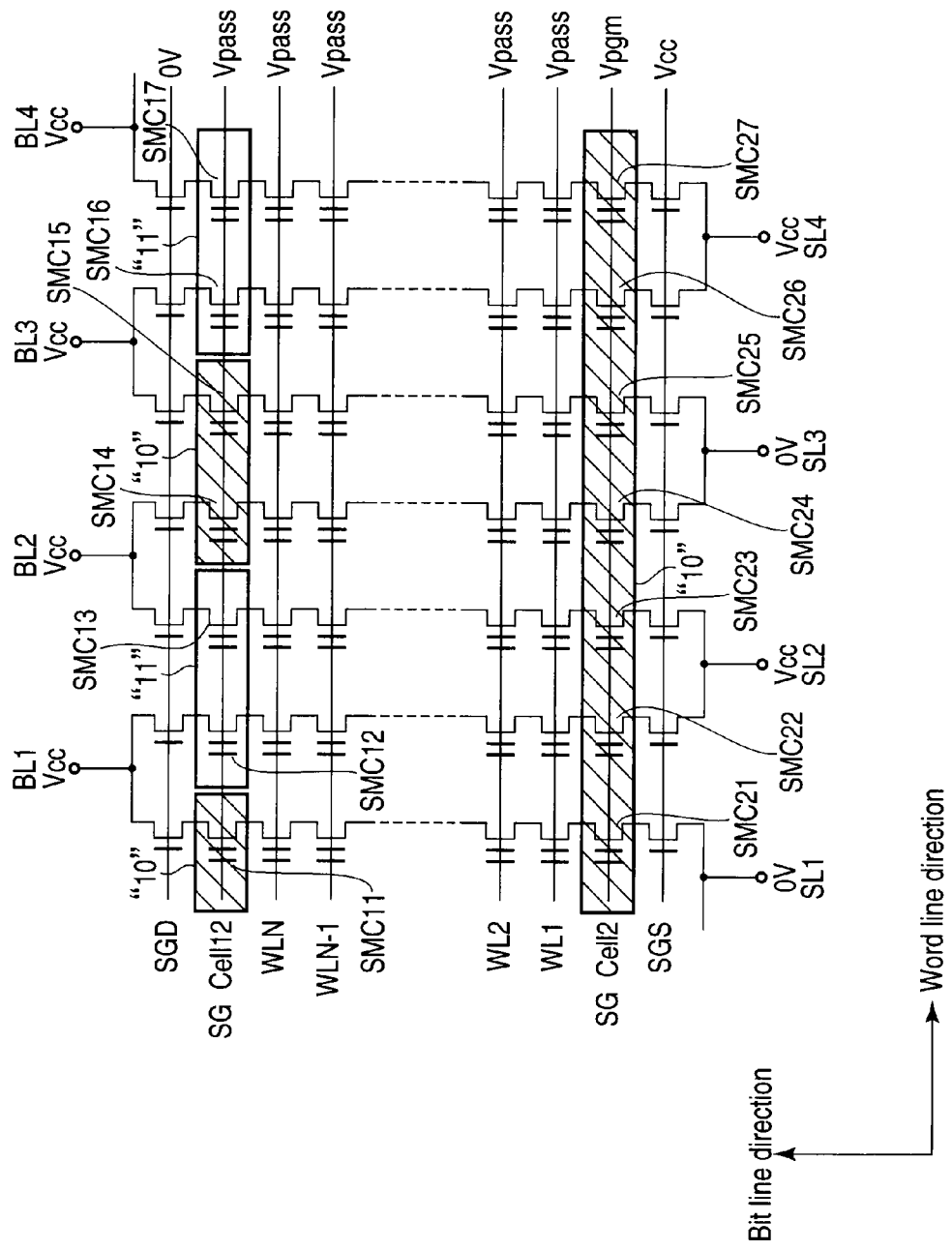
FIG. 11 is a view showing an operation of the preliminary data write of the semiconductor memory device according to the first embodiment.

Subsequently, as shown in FIG. 11, the voltages of the source lines SL are varied from the state of FIG. 10 in the following manner. The voltage of the first and third source lines SL1 and SL3 is set at 0V, and the voltage of the second and fourth source lines SL2 and SL4 is set at Vcc. Under the same condition, data write is executed in the memory cell transistors MC (SMC21, SMC24, SMC25, ...) up to the "10" level. As a result, all memory cell transistors MC (SMC21, SMC22, SMC23, ...), whose gates are the source-side second cell select gate SG Cell2 (WLS), are set at the "10" level.

Figure 12:
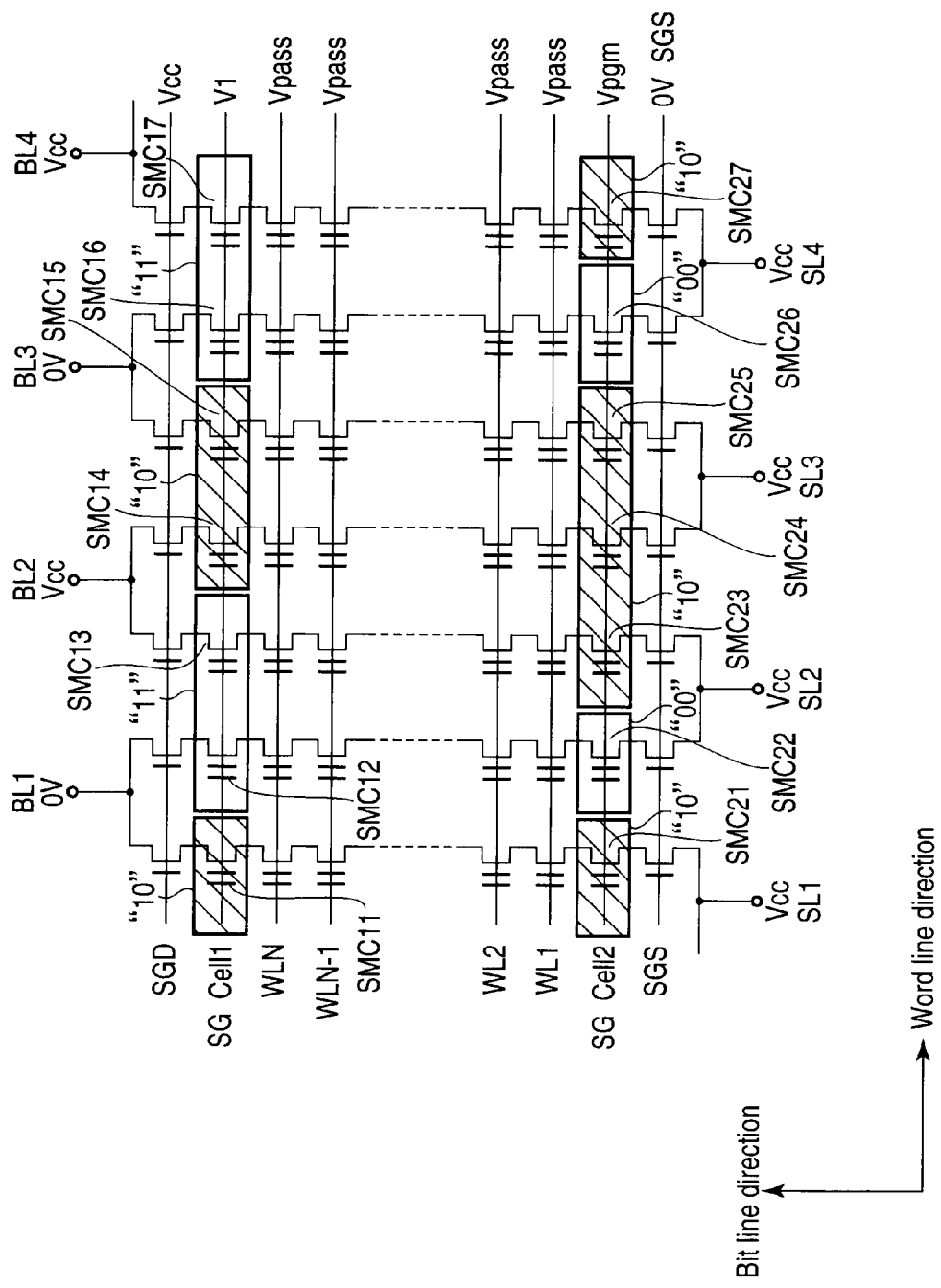
FIG. 12 is a view showing an operation of the preliminary data write of the semiconductor memory device according to the first embodiment.

Then, as shown in FIG. 12, voltages 0 V/Vcc are alternately applied to the bit lines BL from the drain side. For example, 0V is applied to the bit lines BL1 and BL3, Vcc is applied to the bit lines BL2 and BL4, and a voltage V1, e.g. 0V, which is at the "11" level or more and is at the "10" level or less, is applied to the first cell select gate line SG Cell. Further, a voltage Vpgm is applied to the second cell select gate SG Cell2 (WLS), and Vpass is applied to the other word lines WL and the first cell select gate SG Cell. At this time, as shown in FIG. 12, the memory cell transistors, whose gates are the second cell select gate SG Cell2 (WLD), are set at the "10" level/"11" level alternately in units of two bits. Thus, by alternately applying the voltage 0 V/Vcc to the bit lines BL1 to BL4 from the drain side, data write can be executed in the memory cell transistors, whose gates are the first cell select gate SG Cell (WLS), up to the "00" level selectively in units of 5 bits (SMC22, SMC26, ...).

Figure 13:
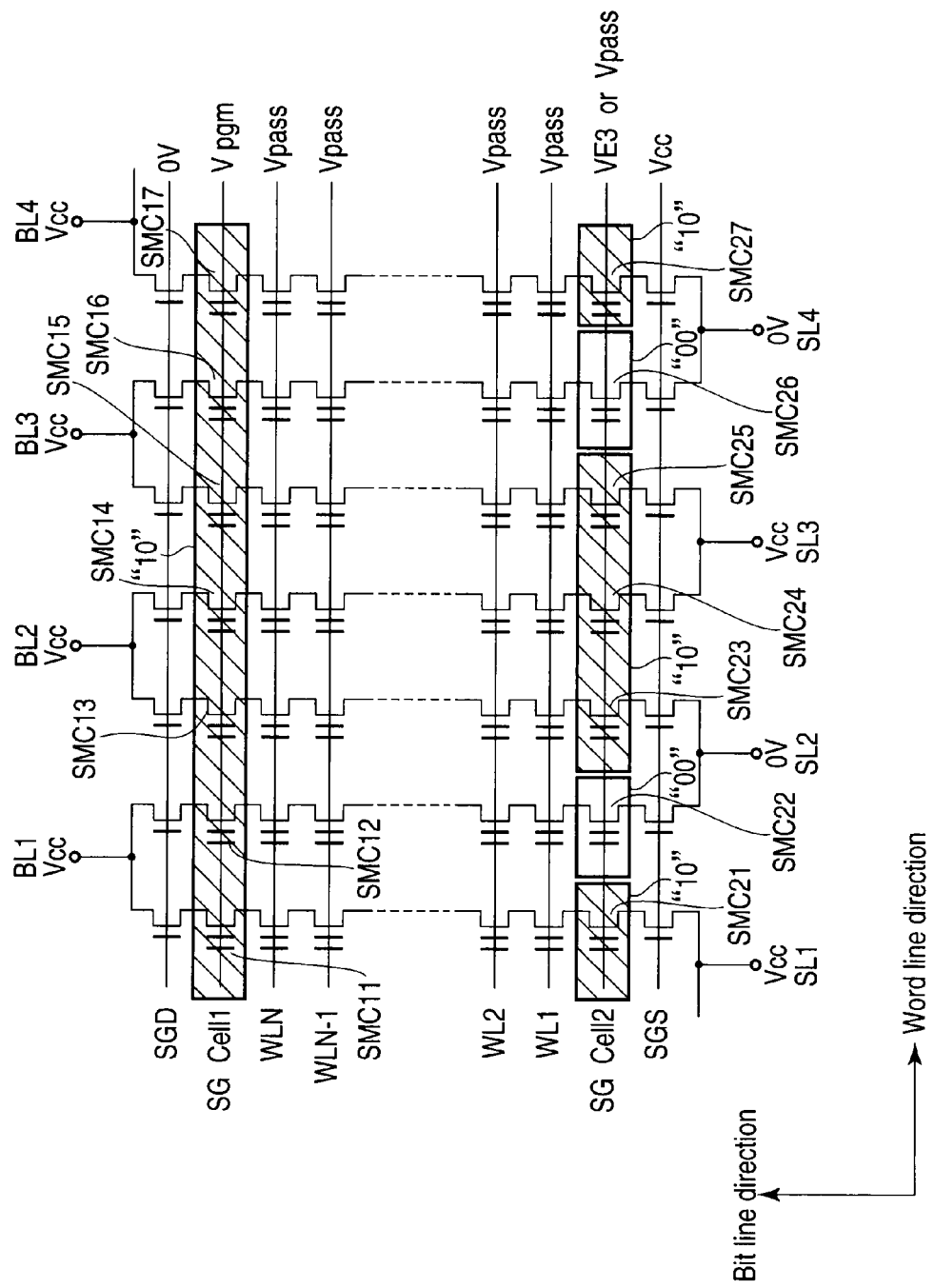
FIG. 13 is a view showing an operation of the preliminary data write of the semiconductor memory device according to the first embodiment.

Subsequently, as shown in FIG. 13, like the case of FIG. 11, data write is executed in all memory cell transistors (SMC12, SMC22, SMC32, ...), whose gates are the first cell select gate SG Cell (WLD), up to the "10" level. At this time, a voltage VE3 or Vpass, which turns on the memory cell transistor at the "00" level, is applied to the second cell select gate SG Cell2(WLS).

Figure 14:
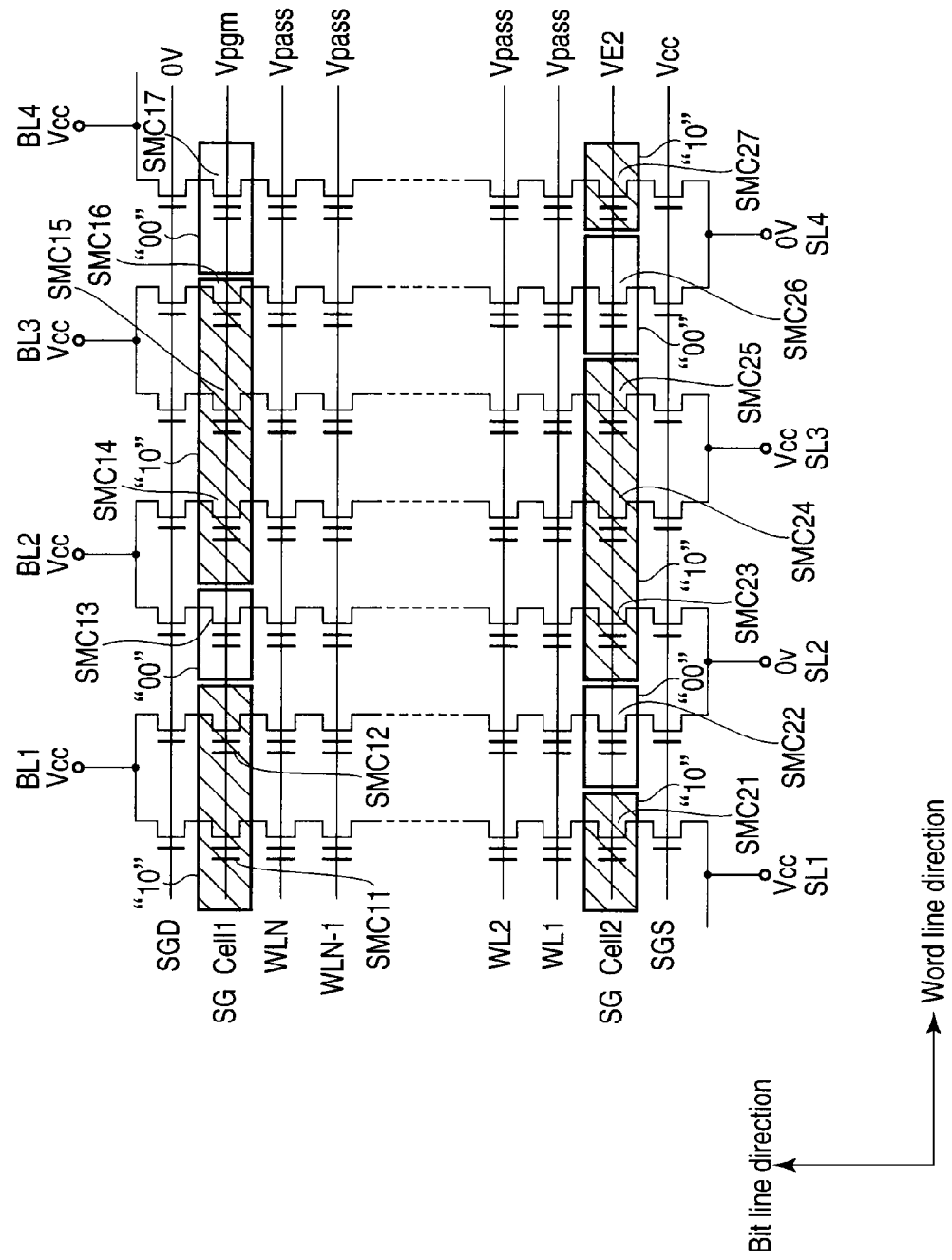
FIG. 14 is a view showing an operation of the preliminary data write of the semiconductor memory device according to the first embodiment.

Then, as shown in FIG. 14, like the case of FIG. 12, data write is executed in the memory cell transistors, whose gates are the first cell select gate SG Cell (WLS), up to the "00" level selectively in units of 5 bits (SMC13, SMC16, ...). At this time, a voltage VE2, which turns on the memory cell transistor at the "10" level and turns off the memory cell transistor at the "00" level, is applied to the second cell select gate SG Cell2 (WLS).

Figure 15:
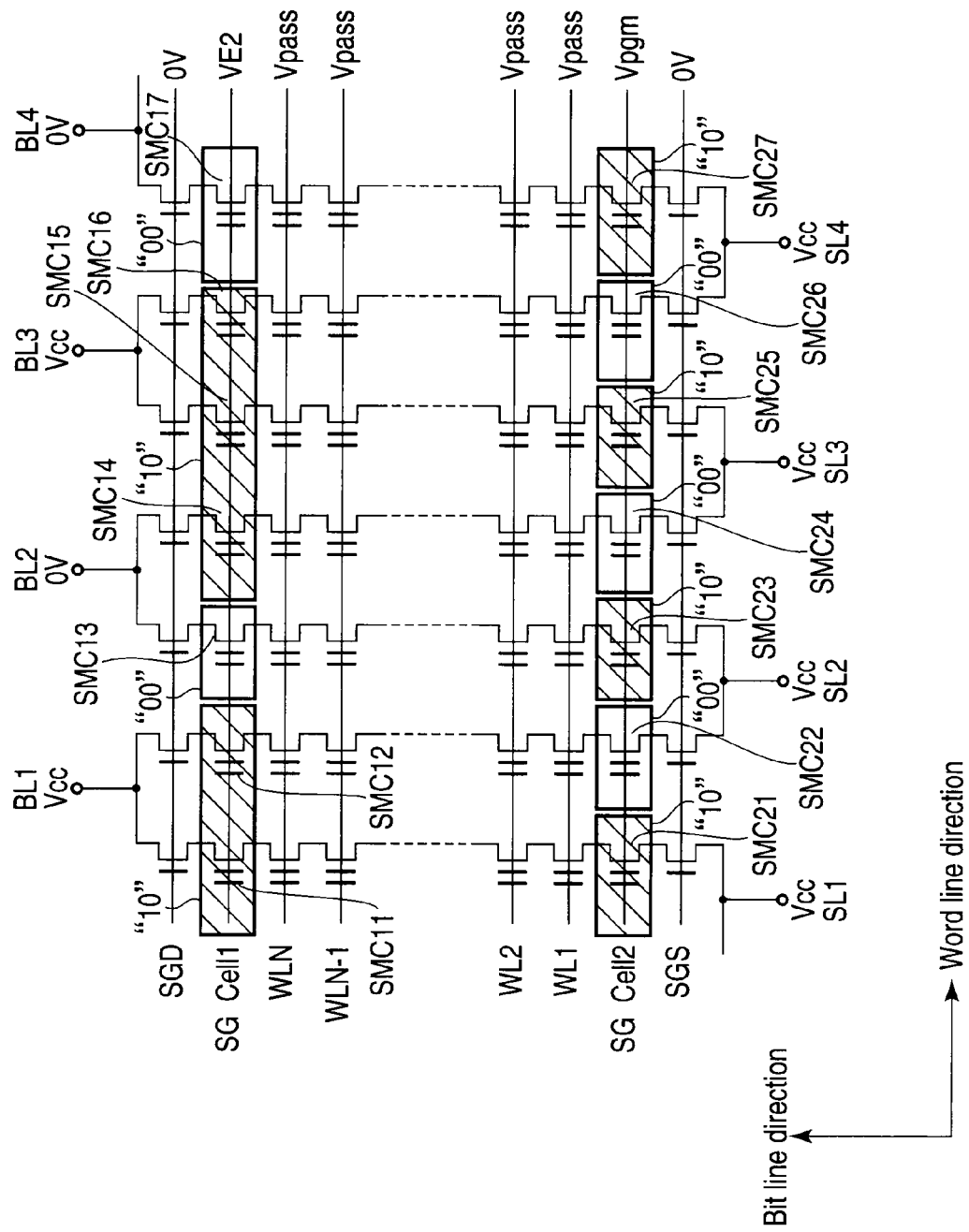
FIG. 15 is a view showing an operation of the preliminary data write of the semiconductor memory device according to the first embodiment.

Following the above, as shown in FIG. 15, the voltage of 0 V/Vcc of the bit line BL, which is shown in FIG. 12, is changed over, and data is written in the second cell select gate SG Cell2 (WLS). At this time, the voltage that is applied to the first cell select gate SG Cell (WLD) is VE2 that turns on the memory cell transistor at the "10" level and turns off the memory cell transistor at the "00" level.

Figure 16:
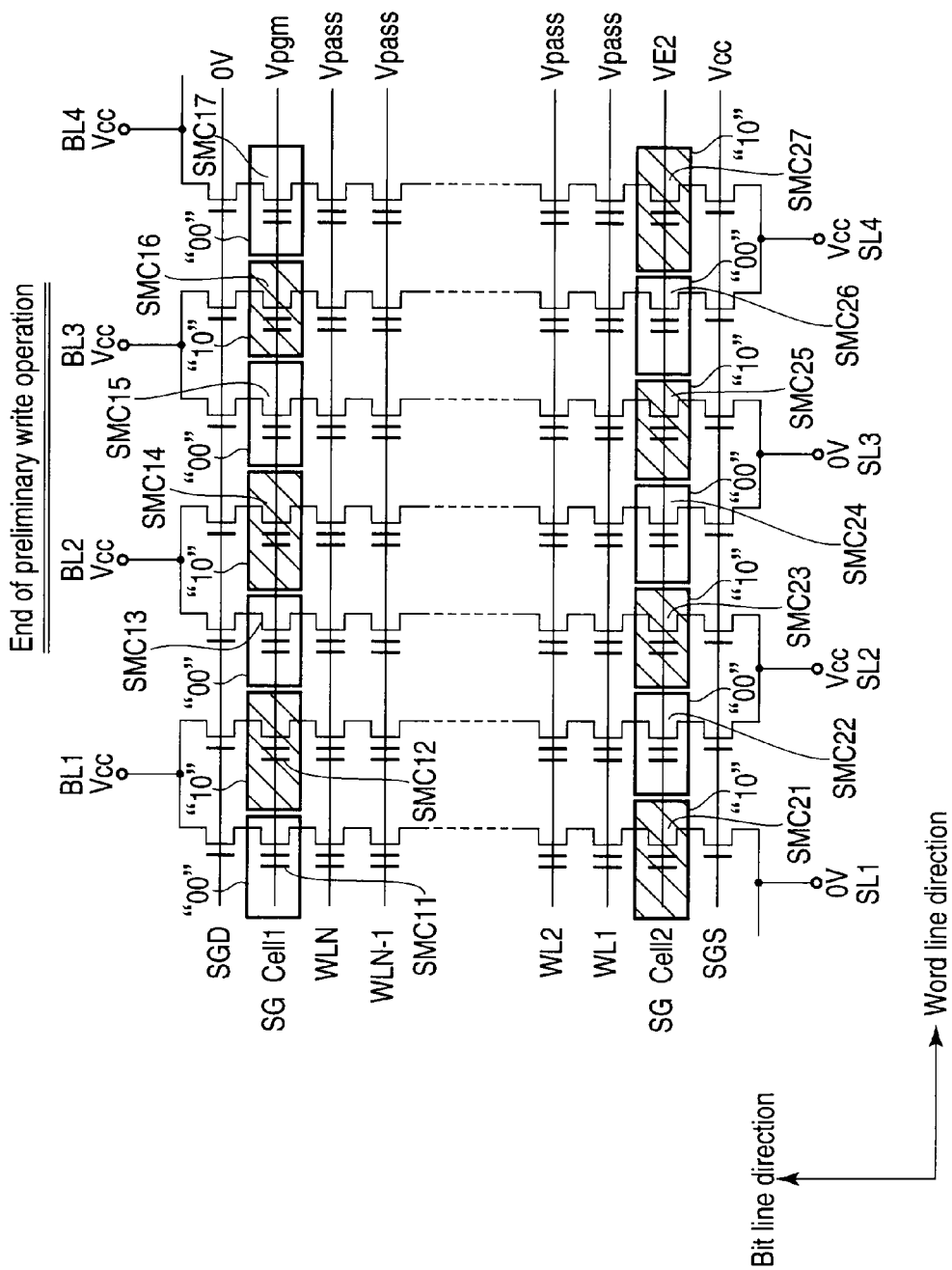
FIG. 16 is a view showing an operation of the preliminary data write of the semiconductor memory device according to the first embodiment.

At last, as shown in FIG. 16, data write is executed so that the memory cell transistors with "00" level/"10" level are alternately arranged in the word line direction on both the drain side and source side, and each memory cell unit includes two select memory cell transistors having threshold voltages of "00" level/"10" level. In this state, the data preliminary write operation is finished. Thereby, at the time of executing the data write operation and data read operation which will be described later, the memory cell transistors (SMC11, SMC12, SMC21, . . . ) which neighbor the select transistors SGD and SGS can be used as select memory cell transistors. Specifically, the bit lines BL1 to BL4, which are shared in units of two with a double pitch contact, can freely be chosen by setting the potential, which is applied to the cell select gate SG Cell1, SG Cell2 (WLS, WLD), at 0V or V1.

3-2. Write Operation

Next, the data write operation is described with reference to FIG. 17 and FIG. 18. This data write is executed after the above-described data preliminary write operation.

Data Write Operation (1)

To start with, data write is executed in the write cells of the memory cell units (MU1, MU3, MU5, MU7, . . . ), which are the memory cell transistors (SMC21, SMC22, . . . ) having the source-side cell select gate SG Cell2 (WLS) as their gates and are set at "10" level.

Figure 17:
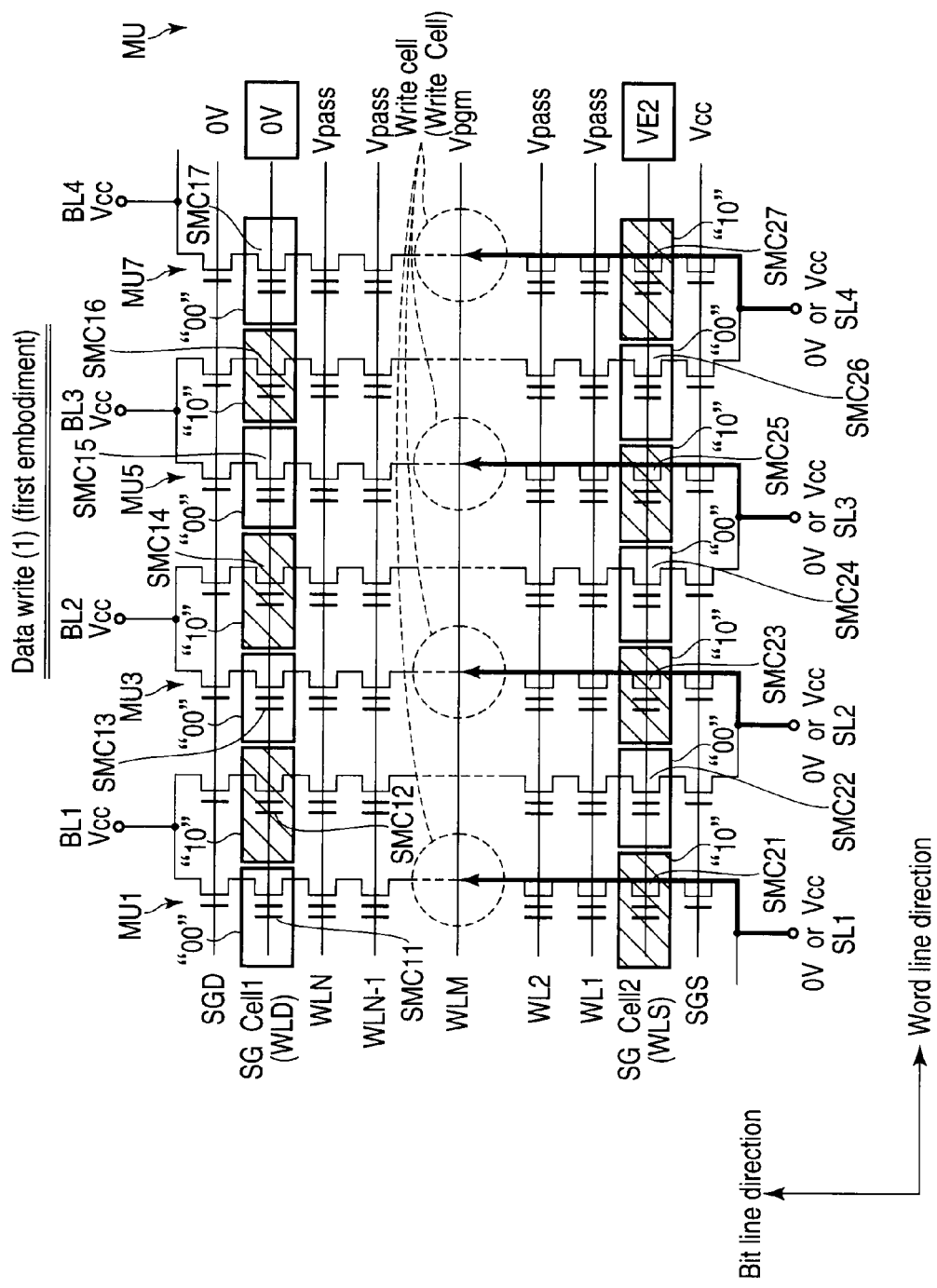
FIG. 17 is a view showing a data write operation (1) of the semiconductor memory device according to the first embodiment.

As shown in FIG. 17, the potential of the drain-side block select gate line SGD is set at Vcc, and the potential of the source-side block select gate line SGS is set at 0V. The potential of the source lines SL (SL1, SL2, . . . ) is set at the potential (0V or Vcc) corresponding to write data. For example, the potential of the source lines SL is set at 0V in the case where the write data is "0", and the potential of the source lines SL is set at Vcc in the case where the write data is "1". The potential of the bit lines BL (BL1, BL2, . . . ) is set at, e.g. Vcc. As a result, all the drain-side block select transistors STD (STD1, STD2, STD3, . . . ) are turned off. Those source-side block select transistors, which are connected to the source line SL to which 0V is applied, are turned on, and those source-side block select transistors, which are connected to the source line SL to which Vcc is applied, are turned off.

Then, the potential of the first cell select gate line SG Cell is set at 0V. All the select memory cell transistors (SMC11, SMC12, SMC13, . . . ) having the first cell select gate line SG Cell as their gates are turned off. The potential of the second cell select gate line SG Cell2 is set at VE2 (a voltage at which the memory cell transistor less or equal "10" level is turned on). The select memory cell transistors SMC (SMC21, SMC22, SMC23, . . . ) having the second cell select gate line SG Cell2 as their gates, those at "00" level are turned off, and those at "10" level are turned on. Then, the potential of the non-select word line WL is set at a pass voltage Vpass. The potential of the select word line WLM is set at a write voltage Vpgm which is higher than the pass voltage Vpass.

The potential of the source line SL (SL1, SL2, . . . ) is conducted to the memory cell units (MU1, MU3, MU5, MU7, . . . ) including turned-on memory cells SMC of all the select memory cell transistors SMC having the second cell select gate line SG Cell2 as their gates.

As a result, in accordance with the potential of the source line SL (SL1, SL2, . . . ), data "0" or data "1" is written in the write cells MC of the memory cell units (MU1, MU3, MU5, MU7, . . . ), which are connected to the memory cell transistors (SMC21, SMC22, . . . ) having the source-side second cell select gate SG Cell2 (WLS) as their gates, which are set at "10" level.

Data Write Operation (2)

Figure 18:
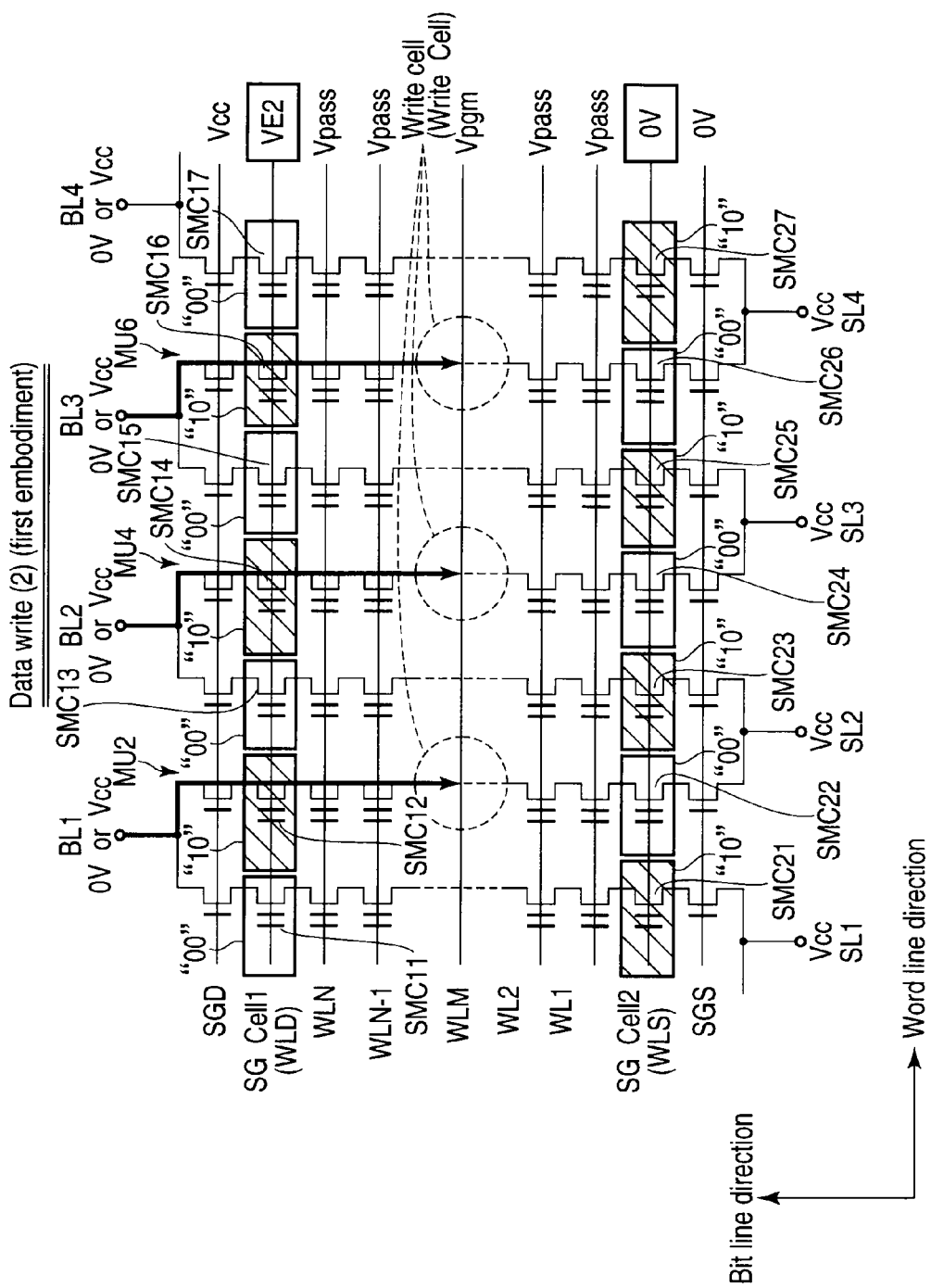
FIG. 18 is a view showing a data write operation (2) of the semiconductor memory device according to the first embodiment.

Next, as shown in FIG. 18, data write is executed in the write cells of the memory cell units (MU2, MU4, MU6, . . . ), which are connected to the memory cell transistors that have the source-side cell select gate SG Cell2 (WLS) as their gates and are set at "10" level.

As shown in FIG. 18, the potential of the drain-side block select gate line SGD is set at Vcc, and the potential of the source-side block select gate line SGS is set at 0V. The potential of the source lines SL (SL1, SL2, . . . ) is set at, e.g. Vcc. The potential of the bit lines BL (BL1, BL2, . . . ) is set at the potential (0V or Vcc) corresponding to write data. As a result, those of the drain-side block select transistors STD (STD1, STD2, STD3, . . . ), which are connected to the bit line BL to which 0V is applied, are turned on. Those of the drain-side block select transistors STD (STD1, STD2, STD3, . . . ), which are connected to the bit line BL to which Vcc is applied, are turned off. All the source-side block select transistors STS (STS1, STS2, STS3, . . . ) are turned off.

Then, the potential of the second cell select gate line SG Cell2 is set at 0V. All the memory cell transistors (SMC21, SMC22, SMC23, . . . ) having the second cell select gate line SG Cell2 as their gates are turned off. The potential of the first cell select gate line SG Cell is set at VE2 (a voltage at which the memory cell transistor less or equal "10" level is turned on). The select memory cell transistors SMC (SMC11, SMC12, SMC13, . . . ) having the first cell select gate line SG Cell1 as their gates, those at "00" level are turned off, and those at "10" level are turned on.

Then, the potential of the non-select word line WL is set at a pass voltage Vpass. The potential of the select word line WLM is set at a write voltage Vpgm which is higher than the pass voltage Vpass.

The potential of the bit line BL (BL1, BL2, . . . ) is conducted to the memory cell units (MU2, MU4, MU6, . . . ) including turned-on memory cells SMC of all the select memory cell transistors SMC having the first cell select gate line SG Cell as their gates. As a result, in accordance with the potential of the bit line BL (BL1, BL2, . . . ), data "0" or data "1" is written in the write cells MC of the memory cell units (MU2, MU4, MU6, . . . ), which are connected to the memory cell transistors (SMC12, SMC22, . . . ) that have the drain-side cell select gate SG Cell2 (WLD) as their gates and are set at "10" level.

Specifically, all the memory cell units can be selected by controlling data write by the bit lines BL and source lines SL.

The order of data write in the memory cell units MU, which are connected to the first and second cell select gate lines SG Cell and SG Cell2, is not limited to the present example, and may be arbitrarily set.

3-3. Read Operation

Next, the data read operation is described with reference to FIG. 19 to FIG. 21.

Data Read Operation (1)

Figure 19:
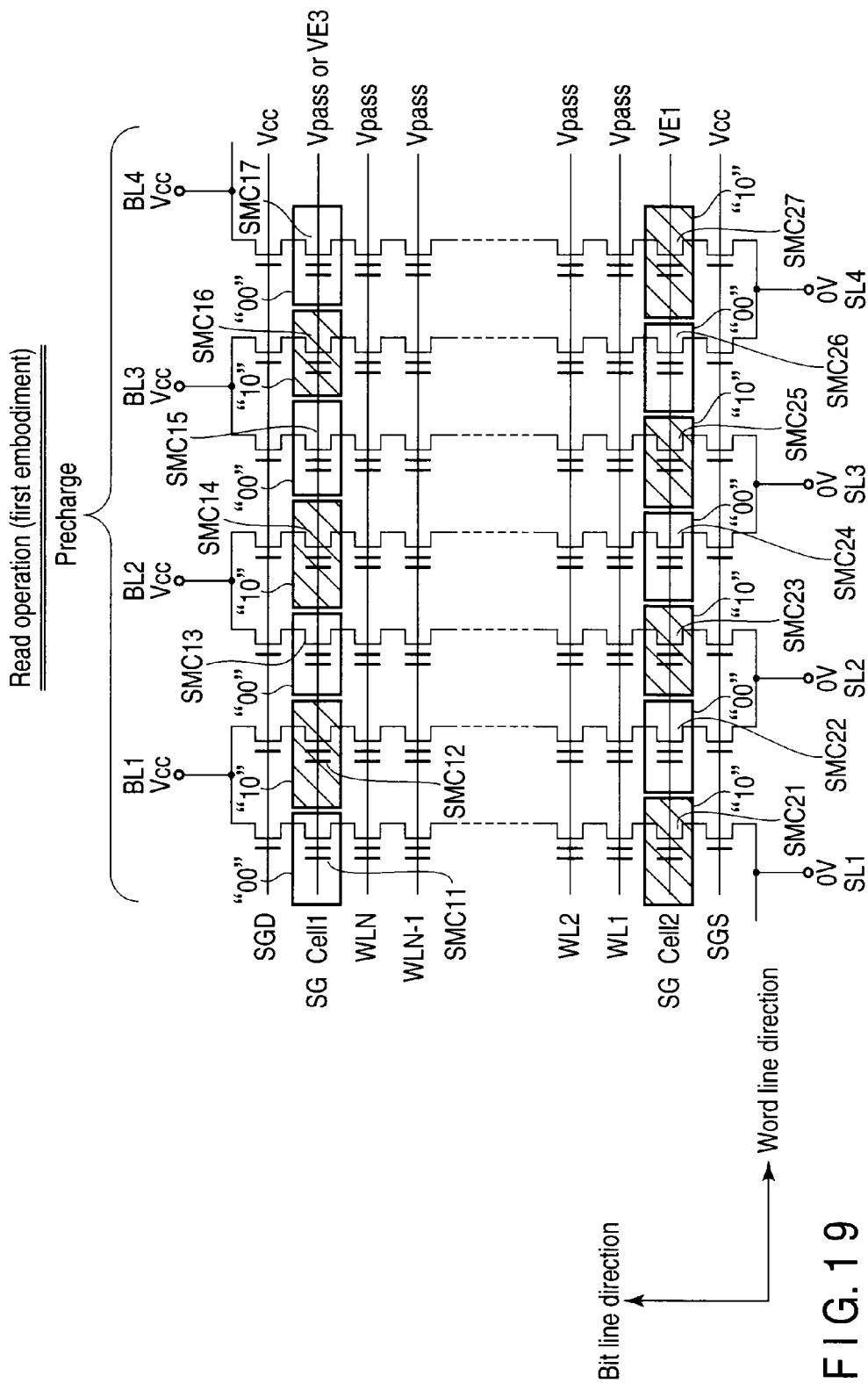
FIG. 19 is a view showing a data read operation (precharge) of the semiconductor memory device according to the first embodiment.

To start with, as shown in FIG. 19, precharge is executed in the memory cell units (MU1, MU3, . . . ). As shown in FIG. 19, the potential of the bit line BL (BL1, BL2, . . . ) is set at a precharge potential (Vcc in this example), and the potential of the source line (SL1, SL2, . . . ) is set at 0V. In addition, the potential of each of the drain-side block select gate line SGD and the source-side block select gate line SGS is set at Vcc. The potential of the first cell select gate line SG Cell1 is set at VE3 or Vpass. The potential of the second cell select gate line SG Cell2 is set at VE2. By setting this relationship in voltage, precharge is executed in the memory cell units (MU1, MU3, . . . ) in which the select memory cell transistors on the second cell select gate line SG Cell2 is at the "00" level.

Besides, no voltage is charged in the memory cell units (MU2, MU4, . . . ) neighboring the precharged memory cells, and these memory cell units function as shielding. As a result, noise can be reduced, and a write margin is improved.

Figure 20:
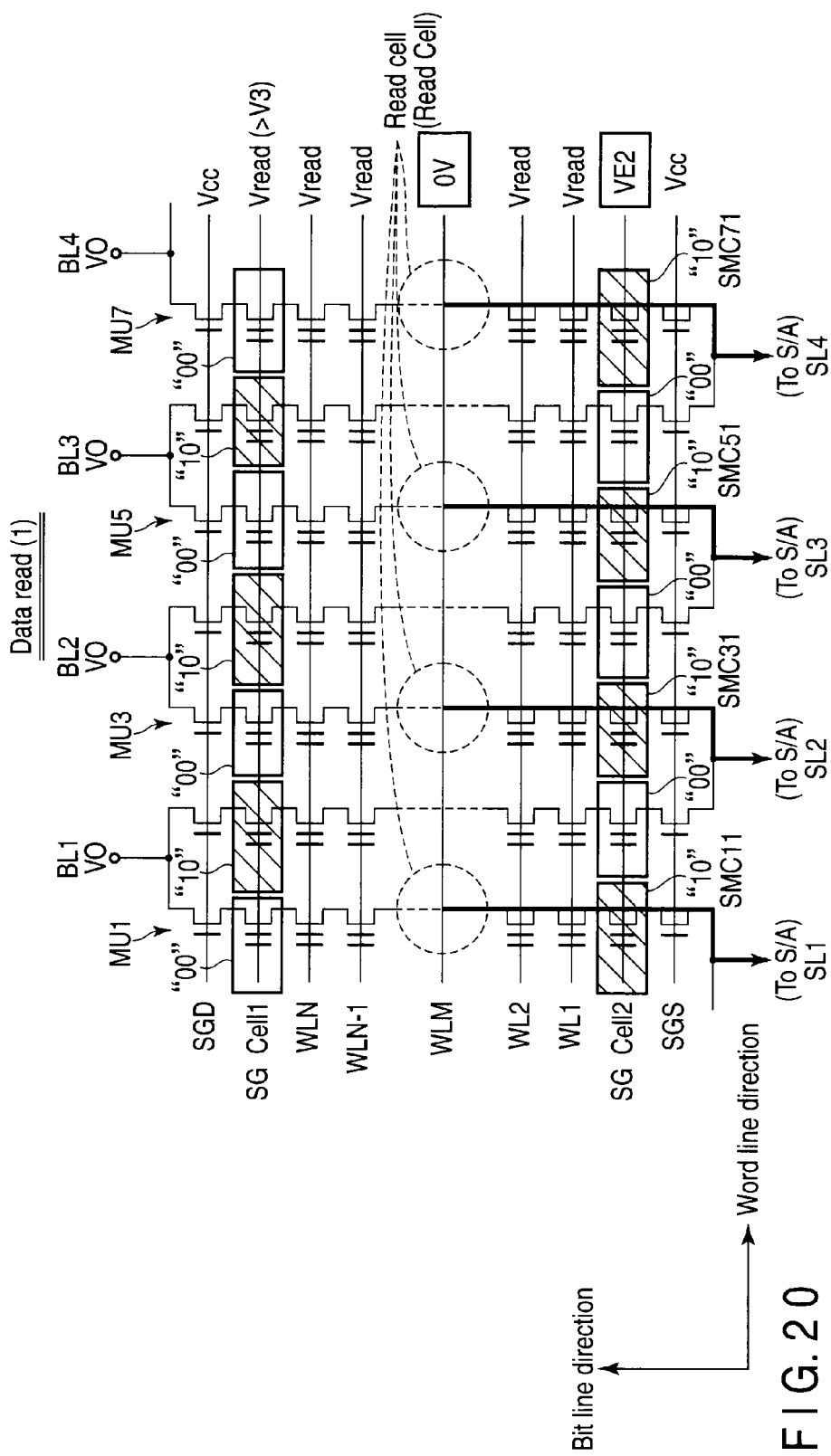
FIG. 20 is a view showing a data read operation (1) of the semiconductor memory device according to the first embodiment.

Then, as shown in FIG. 20, data read is executed from the read cells included in the memory cell units MU1, MU3, MU5 and MU7.

To start with, the potential of the non-select word line WL and the potential of the first cell select gate line SG Cell1 are set at a read voltage Vread (>VE3). The potential of the select word line WLM is set at 0V.

Further, the potential of the second cell select gate line SG Cell2 (WLS) is set at V1 (a voltage at which the transistor less or equal "10" level is turned on). The select memory cell transistors SMC (SMC11, SMC21, SMC31, . . . ) having the second cell select gate line SG Cell2 (WLS) as their gates, those at "00" level are turned off, and those at "10" level are turned on. In the present example, the memory cell transistors SMC (SMC11, SMC13, SMC15, SMC17, . . . ), which are included in the memory cell units MU1, MU3, MU5 and MU7, are turned on.

Further, both the potential of the drain-side block select gate line SGD and the potential of the source-side block select gate line SGS are set at Vcc. All the drain-side block select transistors STD (STD1, STD2, STD3, . . . ) and the source-side block select transistors STS (STS1, STS2, STS3, . . . ) are turned on.

As a result, the sense amplifier S/A detects that the potential of the source line SL (SL1, SL2, . . . ) is maintained or varied, in accordance with whether the memory cell transistors MC (read cells), which are included in the memory cell units MU1, MU3, MU5 and MU7 and have the select word line WLM as their gates, store data "0" or data "1".

Data Read Operation (2)

Figure 21:
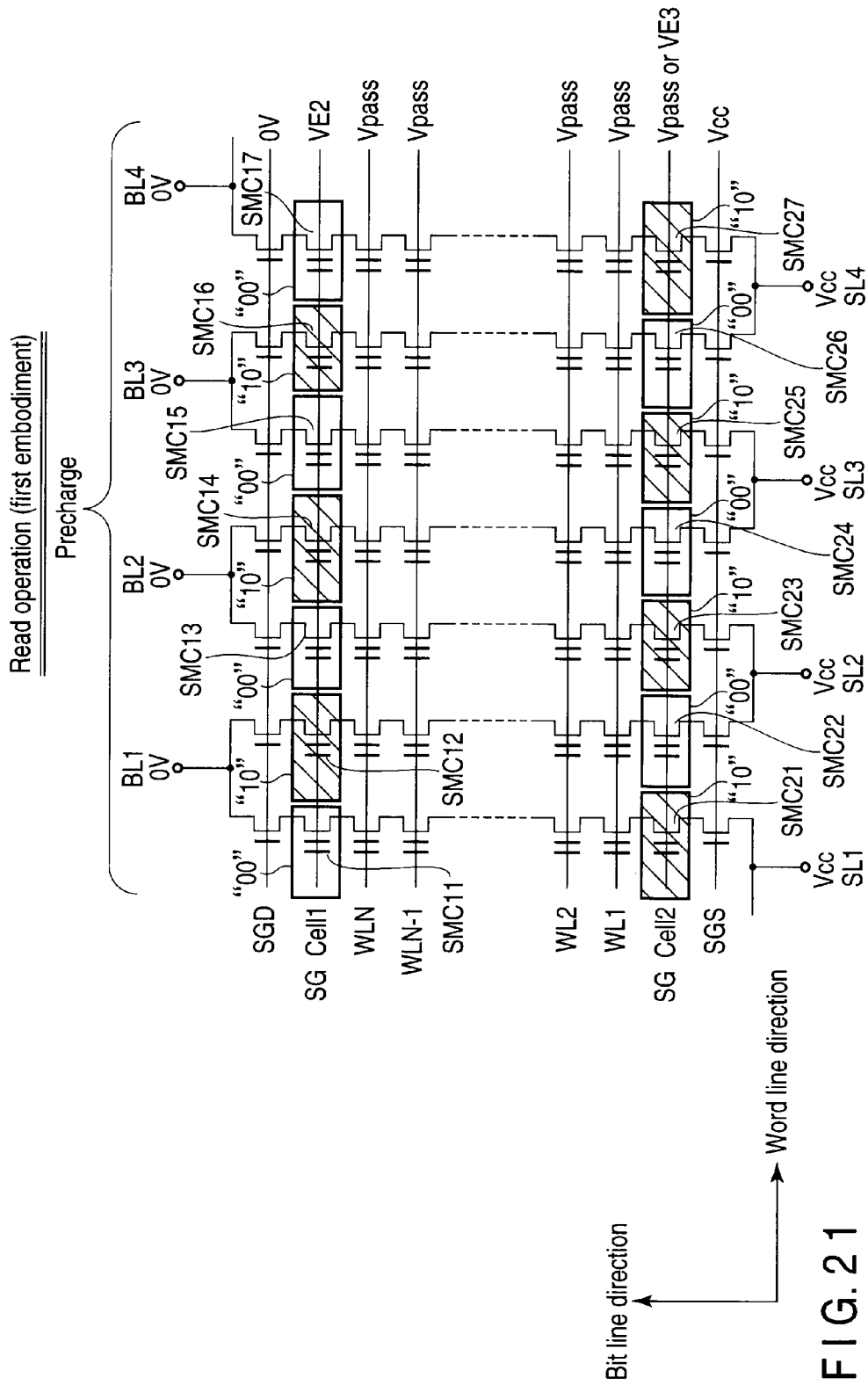
FIG. 21 is a view showing a data read operation (precharge) of the semiconductor memory device according to the first embodiment.

To start with, as shown in FIG. 21, precharge is executed in the memory cell units (MU2, MU4, . . . ). As shown in FIG. 21, the potential of the bit line BL (BL1, BL2, . . . ) is set at Vcc, and the potential of the source line (SL1, SL2, . . . ) is set at a precharge potential (0V in this example). In addition, the potential of each of the drain-side block select gate line SGD and the source-side block select gate line SGS is set at VE3 or Vpass. The potential of the first cell select gate line SG Cell is set at VE2. The potential of the second cell select gate line SG Cell2 is set at Vcc. By setting this relationship in voltage, precharge is executed in the memory cell units (MU2, MU4, . . . ) in which the select memory cell transistors on the second cell select gate line SG Cell2 is at the "00" level.

Besides, no voltage is charged in the memory cell units (MU1, MU3, . . . ) neighboring the precharged memory cells, and these memory cell units function as shielding. As a result, noise can be reduced, and a write margin is improved.

Then, as shown in FIG. 22, data read is executed from the read cells included in the memory cell units MU2, MU4 and MU6.

To start with, the potential of the non-select word line WL and the potential of the first cell select gate line SG Cell are set at a read voltage Vread (>VE3). The potential of the select word line WLM is set at 0V.

Further, the potential of the first cell select gate line SG Cell (WLD) is set at VE2 (a voltage at which the transistor less or equal "10" level is turned on). The select memory cell transistors SMC (SMC12, STMC12, STMC13, . . . ) having the first cell select gate line SG Cell (WLD) as their gates, those at "00" level are turned off, and those at "10" level are turned on. In the present example, the memory cell transistors SMC (SMC12, SMC14, SMC16, . . . ), which are included in the memory cell units MU2, MU4, and MU6, are turned on.

Further, both the potential of the drain-side block select gate line SGD and the potential of the source-side block select gate line SGS are set at Vcc. All the drain-side block select transistors STD (STD1, STD2, STD3, . . . ) and the source-side block select transistors STS (STS1, STS2, STS3, . . . ) are turned on.

As a result, the sense amplifier S/A detects that the potential of the bit line BL (BL1, BL2, . . . ) is maintained or varied, according to whether the memory cell transistors MC (read cells), which are included in the memory cell units MU2, MU4 and MU6 and have the select word line WLM as their gates, store data "0" or data "1".

The data read operation is thus completed.

Like the case of the data write operation, the order of data read is not limited to this example, and may be arbitrarily set.

In addition, in the case of the present example, since the bit line BL selection is executed by making use of the multilevel operation, the memory cell transistors MC (SMC11, STMC12, STMC21, . . . ) having the first and second cell select gate lines SG Cell, SG Cell2 (WLS, WLD) as gates are used as the select memory cell transistors on the basis of the difference in cell threshold value of "10" level/"00" level. However, the threshold level of the memory cell transistor MC (SMC11, STMC12, STMC21, . . . ) is not limited to the present example. In order to improve the selectivity of the bit line BL, for example, it is similarly possible to execute data write by setting threshold levels with a greater threshold difference, such as "10" level/"01" level. Besides, it is possible to make use of, not only the threshold difference of the 2 bit/cell, but also the threshold difference of any multi-bit cell, for example, a negative threshold value.

As has been described above, according to the semiconductor memory device of the present embodiment, at least the following advantageous effects (1) to (3) can be obtained.

(1) Microfabrication can Advantageously be Achieved.

The semiconductor memory device according to the present embodiment, as shown in FIG. 6, comprises the first to third memory cell units MU1 to MU3 each including a plurality of memory cell transistors connected in series between the select transistors; the first bit line BL1 which is commonly connected to one end of the current path of the first memory cell unit MU1 and to one end of the current path of the second memory cell unit MU2; the second bit line BL2 which is connected to one end of the current path of the third memory cell unit MU3; the first source line SL1 which is connected to the other end of the current path of the first memory cell unit MU1; and the second source line SL2 which is commonly connected to the other end of the current path of the second memory cell unit MU2 and to the other end of the current path of the third memory cell unit MU3.

Thus, in the two memory cell units, MU1 to MU3, which neighbor in the word line direction, the source line SL1, SL2, and the bit line BL1, BL2, can be shared by double-pitch contact. Therefore, microfabrication can advantageously be achieved.

(2) The Defect Ratio can be Decreased.

Further, by executing the preliminary data write, the first to sixth memory cell transistors SMC21, SMC11, SMC22, SMC12, SMC23, and SMC 13, which neighbor the select transistors STS and STD of the first to third memory cell units, can be used as select memory cell transistors.

There is a tendency that the defect ratio of memory cells neighboring the select transistors STS and STD increases. The reason is that, for example, the write characteristics and reliability tend to deteriorate due to, e.g. GIDL (gate induced drain leakage).

Figure 23:
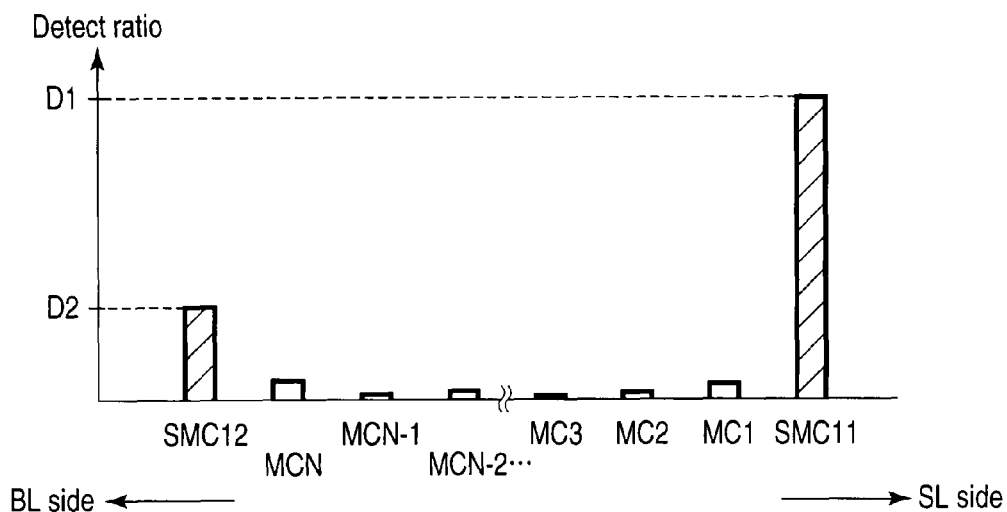
FIG. 23 is a view showing a defect ratio of a memory cell unit of the semiconductor memory device according to the first embodiment.

In the case of the present example, the defect ratio of the first memory cell unit MU1 due to hot carriers is, for example, as shown in FIG. 23. As shown in FIG. 23, according to the structure of the present example, the first and second memory cell transistors SMC11 and SMC12, which neighbor the select transistors STS1 and STD1, are used as select memory cell transistors, and are not made to function as memory cells.

Thus, defect ratios D1 and D2, which are indicated by hatching, can be eliminated. In particular, the source-side defect ratio D1, which is large, can be eliminated. As has been described above, since the defect ratios D1 and D2 can be eliminated, the defect ratio of the memory cell unit MU1 can be decreased. The same applies to the other memory cell units MU2, MU3, . . . .

As described above, the structure of the present example is advantageous for microfabrication, and the defect ratio can advantageously be decreased.

(3) The Manufacturing Cost can Advantageously be Reduced.

In the present example, as described above, the memory cell transistors (SMC21, SMC11, SMC22, . . . ) which neighbor the select transistors STS and STD are usable as the select memory cell transistors. Accordingly, there is no need to dispose dummy cells at the memory cell transistors (SMC21, SMC11, SMC22, . . . ) which neighbor the select transistors STS and STD.

Therefore, since the double pitch (bi-pitch) can be realized without chip size impact and the number of fabrication steps does not increase, the manufacturing cost can advantageously be reduced.

Second Embodiment

An Example of Staggered Arrangement

Next, a semiconductor memory device according to a second embodiment of the present invention is described with reference to FIG. 24 and FIG. 25. This embodiment relates to an example in which source line contacts and bit line contacts are arranged in a staggered fashion. A detailed description of the parts common to those in the first embodiment is omitted here.

Figure 25:
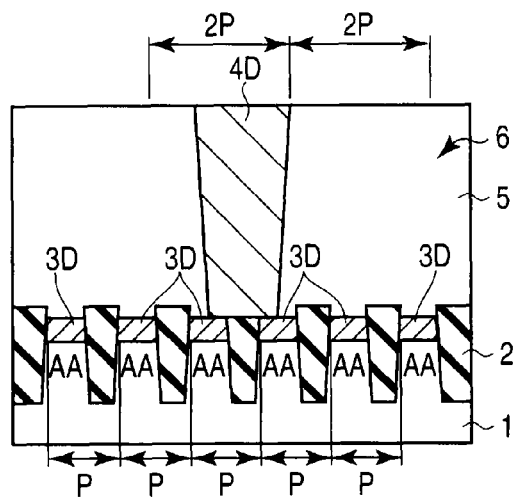
FIG. 25 is a cross-sectional view taken along line XXV-XXV in FIG. 23.
Figure 24:
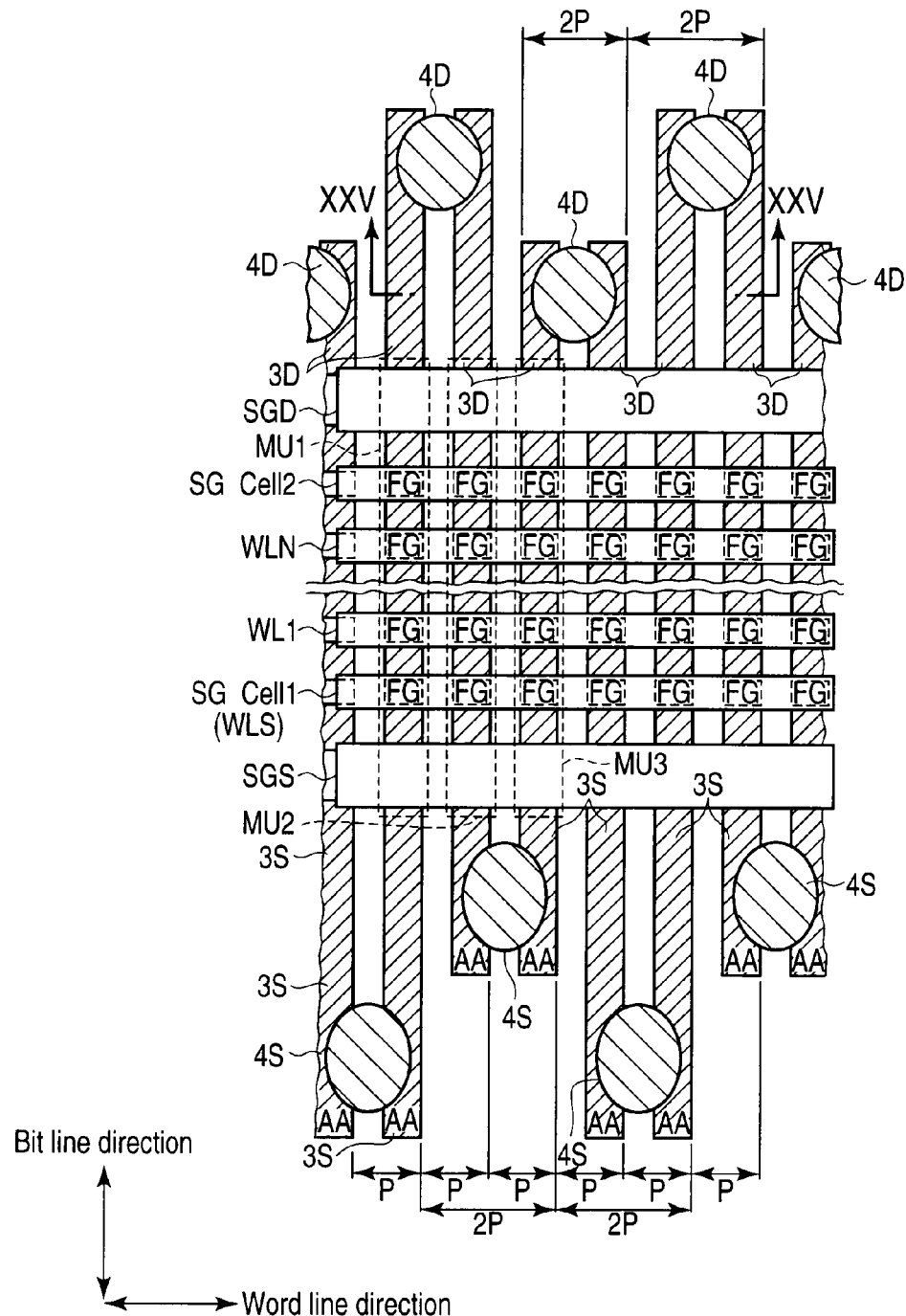
FIG. 24 is a plan view showing a plan-view structure of a semiconductor memory device according to a second embodiment of the present invention.

FIG. 24 is a plan view showing the semiconductor memory device according to the present embodiment, and FIG. 25 is a cross-sectional view taken along line XXV-XXV in FIG. 24. As shown in FIG. 24 and FIG. 25, the second embodiment differs from the first embodiment in that parts of the device regions AA are made to extend in the bit line direction, and the source line contacts 4S and bit line contacts 4D are arranged in a so-called staggered fashion such that the distances of the source line contacts 4S and bit line contacts 4D from the select gate lines SGD and SGS are made to differ alternately.

Since the cell operations, etc. of the second embodiment are the same as those of the first embodiment, a detailed description thereof is omitted here.

According to the above-described semiconductor memory device of the present embodiment, at least the same advantageous effects (1) to (3) as described above can be obtained.

Further, according to the second embodiment, parts of the device regions AA are made to extend in the bit line direction, and the source line contacts 4S and bit line contacts 4D are arranged in the staggered fashion. Thus, in the structure of this embodiment, even if the degree of microfabrication progresses and the distance (2P) between the contacts 4S and contacts 4D in the word line direction decreases, the distance between the contacts 4S, 4D can be made to greater than 2P. Therefore, microfabrication can advantageously be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first to third memory cell units each including a first select transistor, a second select transistor and a plurality of memory cell transistors which are connected in series in a first direction between the first select transistor and the second select transistor, the first select transistors of the respective memory cell units being adjacent to each other in a second direction and the second select transistors of the respective memory cell units being adjacent to each other in the second direction;
   a first bit line which is commonly connected to an end portion of the first select transistor of the first memory cell unit and to an end portion of the first select transistor of the second memory cell unit;
   a second bit line which is connected to an end portion of the first select transistor of the third memory cell unit;
   a first source line which is connected to an end portion of the second select transistor of the first memory cell unit; and
   a second source line which is commonly connected to an end portion of the second select transistor of the second memory cell unit and to an end portion of the second select transistor of the third memory cell unit,
   wherein those of the memory cell transistors, which neighbor the first and second select transistors, are used as select memory cell transistors, and
   the select memory cell transistors include a first and second select memory cell transistor where each of the first and second select memory cell transistors includes a charge accumulation layer which is configured to store multi-bit data.

2. The device according to claim 1, wherein the first select memory cell transistor has a first threshold voltage, and the second select memory cell transistor has a second threshold voltage which is higher than the first threshold voltage.

3. The device according to claim 2, wherein each of the first to third memory cell units includes the first select memory cell transistor and the second select memory cell transistor.

4. The device according to claim 3, wherein the first select memory cell transistors and the second select memory cell transistors of the first to third memory cell units to alternatively neighbor in the second direction.

5. The device according to claim 1, further comprising a memory cell block including the first to third memory cell units,
   wherein preliminary data write is executed in the select memory cell transistors when the memory cell block is in a format state.

6. A semiconductor memory device comprising:
   first to third memory cell units each including a first select transistor, a second select transistor and a plurality of memory cell transistors which are connected in series in a first direction between the first select transistor and the second select transistor, the first select transistors of the respective memory cell units being adjacent to each other in a second direction and the second select transistors of the respective memory cell units being adjacent to each other in the second direction;
   a first bit line which is commonly connected to an end portion of the first select transistor of the first memory cell unit and to an end portion of the first select transistor of the second memory cell unit;

a second bit line which is connected to an end portion of the first select transistor of the third memory cell unit;

a first source line which is connected to an end portion of the second select transistor of the first memory cell unit;

a second source line which is commonly connected to an end portion of the second select transistor of the second memory cell unit and to an end portion of the second select transistor of the third memory cell unit;

first and second bit line contacts which are electrically connected to the first and second bit lines and are disposed in a staggered fashion; and first and second source line contacts which are electrically connected to the first and second source lines and are disposed in a staggered fashion, wherein those of the memory cell transistors, which neighbor the first and second select transistors, are used as select memory cell transistors, and the select memory cell transistors include a first and second select memory cell transistor where each of the first and second select memory cell transistors includes a charge accumulation layer which is configured to store multi-bit data.

7. The device according to claim 6, wherein the first select memory cell transistor has a first threshold voltage, and the second select memory cell transistor has a second threshold voltage which is higher than the first threshold voltage.

8. The device according to claim 7, wherein each of the first to third memory cell units includes the first select memory cell transistor and the second select memory cell transistor.

9. The device according to claim 8, wherein the first select memory cell transistors and the second select memory cell transistors of the first to third memory cell units alternatively neighbor in the second direction.

10. The device according to claim 6, further comprising a memory cell block including the first to third memory cell units, wherein preliminary data write is executed in the select memory cell transistors when the memory cell block is in a format state.

11. A method of preliminary data writing to a memory unit, the memory unit including, first to third memory cell units each including a first select transistor, a second select transistor and a plurality of memory cell transistors which are connected in series in a first direction between the first select transistor and the second select transistor, the first and select transistors of the respective memory cell units being adjacent to each other in a second direction and the second select transistors of the respective memory cell units being adjacent to each other in the second direction the plurality of memory cell transistors include, a first select memory cell transistor adjacent to the first select transistor of the first memory cell unit, a second select memory cell transistor adjacent to the second select transistor of the first memory cell unit, a third select memory cell transistor adjacent to the first select transistor of the second memory cell unit, a fourth select memory cell transistor adjacent to the second select transistor of the second memory cell unit, a fifth select memory cell transistor adjacent to the first select transistor of the third memory cell unit, a sixth select memory cell transistor adjacent to the second select transistor of the third memory cell unit, said method comprising:

setting the first select memory cell transistor to a third threshold voltage which is lower than a second threshold voltage to form a fourth threshold voltage which is lower than the third threshold voltage, and setting the fourth and sixth select memory cell transistors to the third threshold voltage to form the fourth threshold voltage which is lower than the third threshold voltage, before the first, fourth and sixth select memory cell transistors have a first threshold voltage, and the second, third and fifth select memory cell transistors have the second threshold voltage.

12. The method of preliminary data writing according to claim 11, further comprising setting the second, fourth and sixth select memory cell transistors to the second threshold voltage after the fourth and sixth select memory cell transistors have the third threshold voltage.

13. The method of preliminary data writing according to claim 12, further comprising setting the fourth select memory cell transistor to the second threshold voltage after the second, fourth and sixth select memory cell transistors have the second threshold voltage.

14. The method of preliminary data writing according to claim 13, further comprising setting the first, third and fifth select memory cell transistors to the second threshold voltage after the fourth select memory cell transistor has the second threshold voltage.

15. The method of preliminary data writing according to claim 14, further comprising setting the fifth select memory cell transistor to the first threshold voltage after the first, third and fifth select memory cell transistors have the second threshold voltage.

16. The method of preliminary data writing according to claim 15, further comprising setting the first select memory cell transistor to the first threshold voltage after the fifth select memory cell transistor has the first threshold voltage.

* * * * *